(12) United States Patent
Takahashi

(10) Patent No.: US 11,107,776 B2
(45) Date of Patent: Aug. 31, 2021

(54) SEMICONDUCTOR DEVICE

(71) Applicant: FUJI ELECTRIC CO., LTD., Kawasaki (JP)

(72) Inventor: Seiichi Takahashi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/262,374

(22) Filed: Jan. 30, 2019

(65) Prior Publication Data
US 2019/0287926 A1 Sep. 19, 2019

(30) Foreign Application Priority Data
Mar. 15, 2018 (JP) .............................. JP2018-047464

(51) Int. Cl.
*H01L 23/047* (2006.01)
*H01L 23/08* (2006.01)
(Continued)

(52) U.S. Cl.
CPC .......... *H01L 23/562* (2013.01); *H01L 23/047* (2013.01); *H01L 23/06* (2013.01); *H01L 23/08* (2013.01); *H01L 23/3735* (2013.01); *H01L 24/32* (2013.01); *H01L 2224/32225* (2013.01); *H01L 2924/10253* (2013.01); *H01L 2924/10272* (2013.01); *H01L 2924/12032* (2013.01); *H01L 2924/13055* (2013.01); *H01L 2924/13091* (2013.01); *H01L 2924/3512* (2013.01)

(58) Field of Classification Search
CPC .......................... H01L 23/053; H01L 21/4842
See application file for complete search history.

(56) References Cited

U.S. PATENT DOCUMENTS

2010/0258922 A1 10/2010 Nakamura et al.
2016/0104631 A1* 4/2016 Guth ................. H01L 23/49811
361/728
(Continued)

FOREIGN PATENT DOCUMENTS

JP S54-163677 A 12/1979
JP S63-067762 A 3/1988
(Continued)

OTHER PUBLICATIONS

Masami Itabashi, "Nano Molding Technology (NMT) Allows Direct Bonding between Metal and Plastic", Journal of the Surface Finishing Society of Japan, vol. 66, No. 8, 2015.

*Primary Examiner* — Xiaoming Liu
(74) *Attorney, Agent, or Firm* — Rabin & Berdo, P.C.

(57) ABSTRACT

A semiconductor includes a semiconductor element, a connecting terminal electrically connected to the semiconductor element, and a case including an opening space for housing the semiconductor element, a frame which surrounds the opening space and in which the connecting terminal is partially embedded, and a terminal arrangement portion protruding from the frame towards the opening space. The connecting terminal includes an internal terminal portion that extends towards the opening space with respect to the frame, the internal terminal portion having a front surface that is electrically connected to the semiconductor element and exposed to the opening space, and a rear surface that is fixed to the terminal arrangement portion.

15 Claims, 16 Drawing Sheets

(51) Int. Cl.
*H01L 23/373* (2006.01)
*H01L 23/00* (2006.01)
*H01L 23/06* (2006.01)

(56) References Cited

U.S. PATENT DOCUMENTS

| | | | |
|---|---|---|---|
| 2016/0379912 A1 | 12/2016 | Komatsu | |
| 2018/0019181 A1* | 1/2018 | Konishi | H01L 23/053 |
| 2018/0033720 A1* | 2/2018 | Tsukamoto | H01L 23/538 |
| 2018/0082921 A1* | 3/2018 | Grassmann | H01L 23/49537 |

FOREIGN PATENT DOCUMENTS

| | | |
|---|---|---|
| JP | H11-354662 A | 12/1999 |
| JP | 2000-349219 A | 12/2000 |
| JP | 2004-134624 A | 4/2004 |
| JP | 2010-245417 A | 10/2010 |
| JP | 2011-014739 A | 1/2011 |
| JP | 2017-017109 A | 1/2017 |

* cited by examiner

SEMICONDUCTOR DEVICE

CROSS-REFERENCE TO RELATED APPLICATION

This application is based upon and claims the benefit of priority of the prior Japanese Patent Application No. 2018-047464, filed on Mar. 15, 2018, the entire contents of which are incorporated herein by reference.

BACKGROUND OF THE INVENTION

1. Field of the Invention

The embodiments relate to a semiconductor device.

2. Background of the Related Art

A semiconductor device includes multiple power semiconductor elements and is used as a power conversion element in an inverter device, for example. Included in the power semiconductor elements are metal-oxide semiconductor field-effect transistors (MOSFET), insulated-gate bipolar transistors (IGBT), or free-wheeling diodes (FWD), for example. The power semiconductor elements may also be reverse conducting-IGBTs (RC-IGBT) in which IGBT and FWD are unified or reverse blocking-IGBTs (RB-IGBT) which have sufficiently high withstand voltage against reverse bias, for example.

In such a power semiconductor device, the semiconductor elements are joined to a ceramic circuit substrate by soldering and electrically connected to one end of a lead frame that provides connecting terminals. In addition, these semiconductor elements and the ceramic circuit substrate of the semiconductor device are housed in a case. The case is formed by insert molding, such that the one end of each lead of the lead frame is placed inside the case while the other end extends outside of the case. See, for example, Japanese Laid-open Patent Publication Nos. 2011-014739 and 2004-134624.

The connecting terminals, which are placed within the case by insert molding, may expand or contract differently from the resin-made case, when the resin solidifies and contracts during the molding process. The same may also occur as a result of thermal changes such as thermal cycling during operation. The stress caused by the difference in expansion and contraction may concentrate at a weak point in the case and cause a crack to appear and grow. In this context, possible weak points in the case include minute cracks, scars, corners, and the like, where the stress could easily increase and concentrate. The appearance and growth of cracks in the case would deteriorate reliability of the semiconductor device.

SUMMARY OF THE INVENTION

According to one aspect, there is provided a semiconductor device including: a semiconductor element; a connecting terminal that is electrically connected to the semiconductor element; and a case including an opening space for housing the semiconductor element, a frame which surrounds the opening space and in which the connecting terminal is partially embedded, and a terminal arrangement portion which protrudes from the frame towards the opening space. The connecting terminal therein includes an internal terminal portion that extends towards the opening space with respect to the frame. The internal terminal portion includes a front surface that is electrically connected to the semiconductor element and exposed to the opening space, and further includes a rear surface that is fixed to the terminal arrangement portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described in detail below with reference to the accompanying drawings.

First Embodiment

Figure 1:
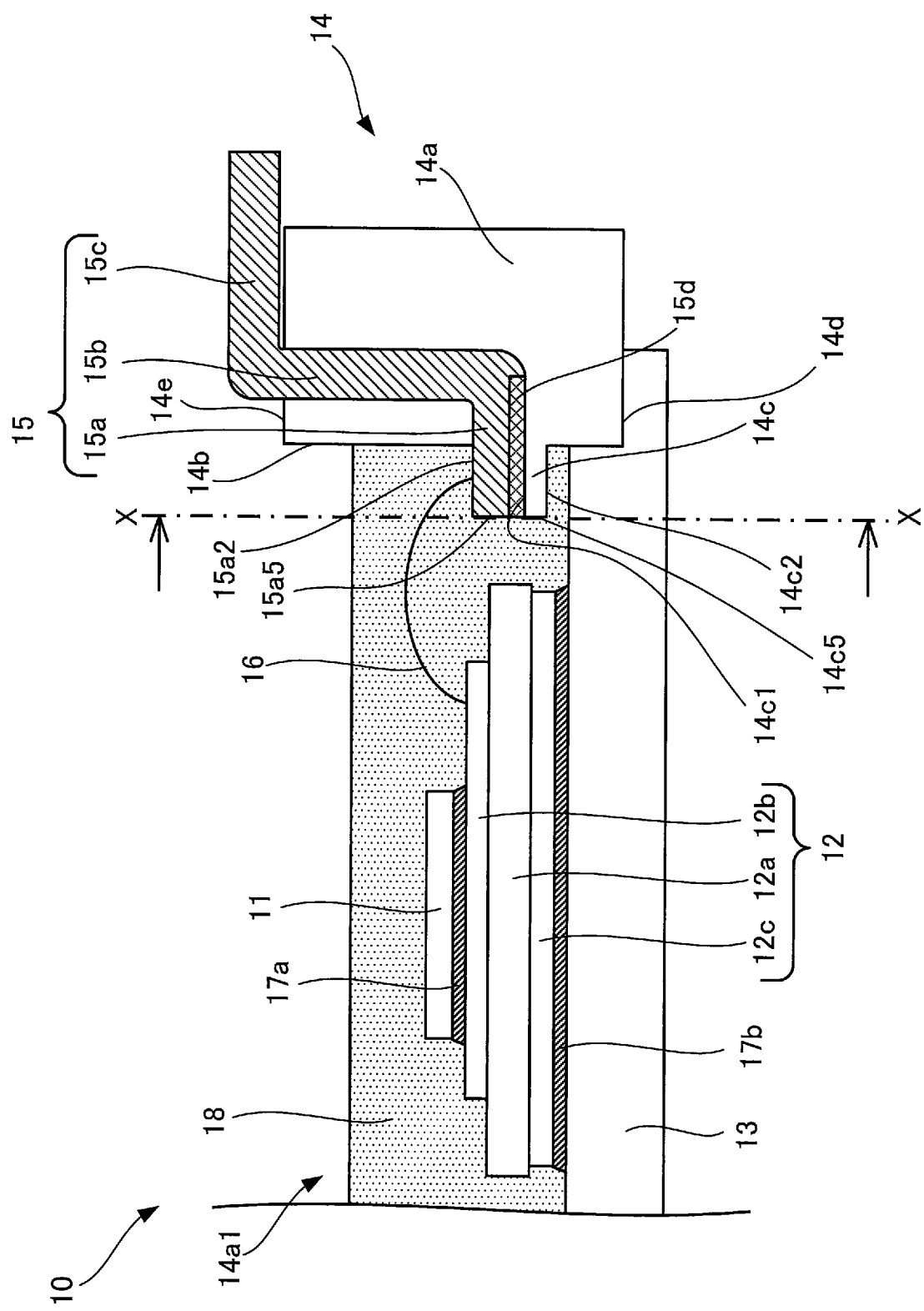
FIG. 1 is a cross-sectional view illustrating, by way of example, a main part of a semiconductor device according to a first embodiment.
Figure 2:
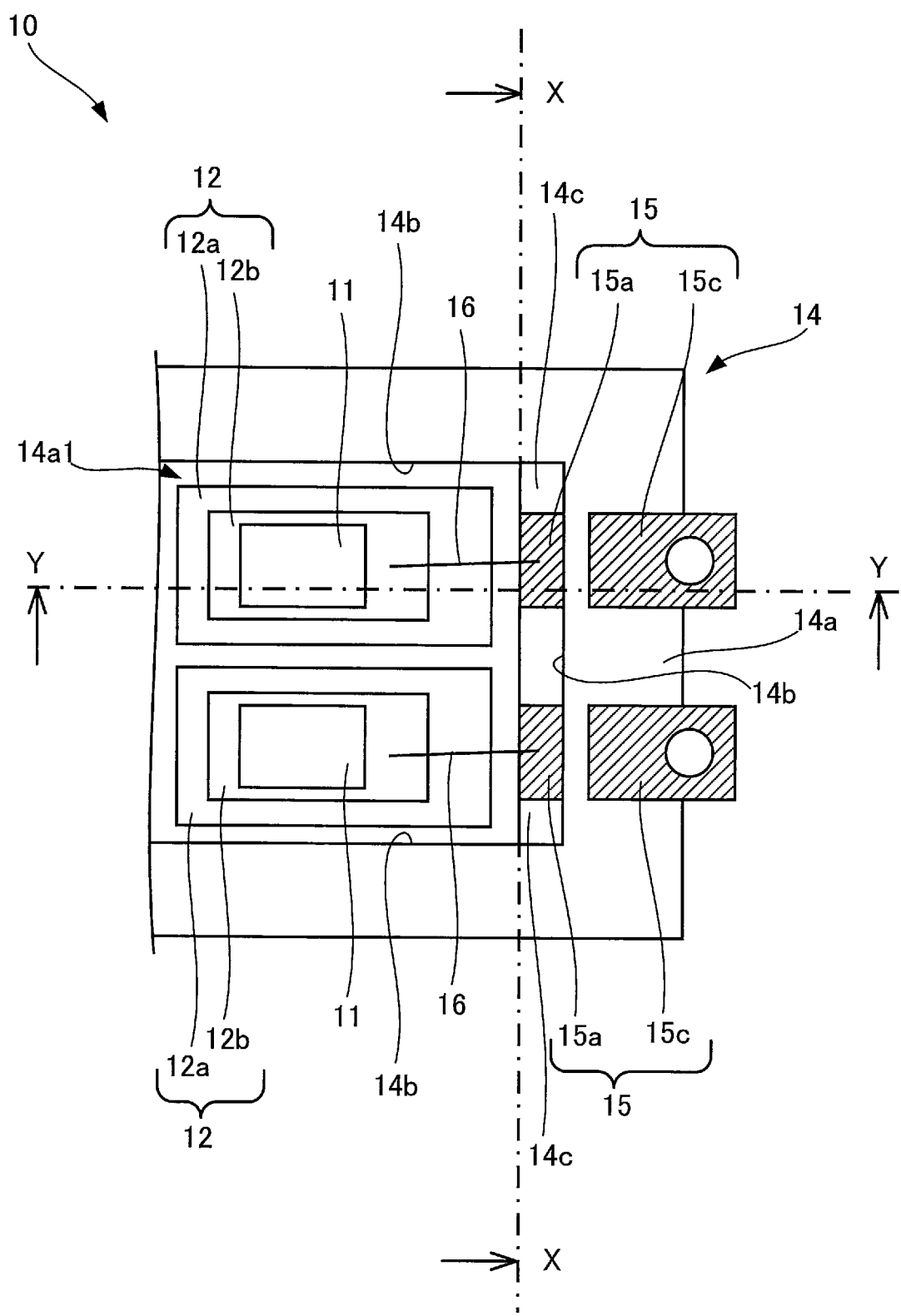
FIG. 2 is a plan view illustrating, by way of example, a main part of the semiconductor device according to the first embodiment.
Figure 3:
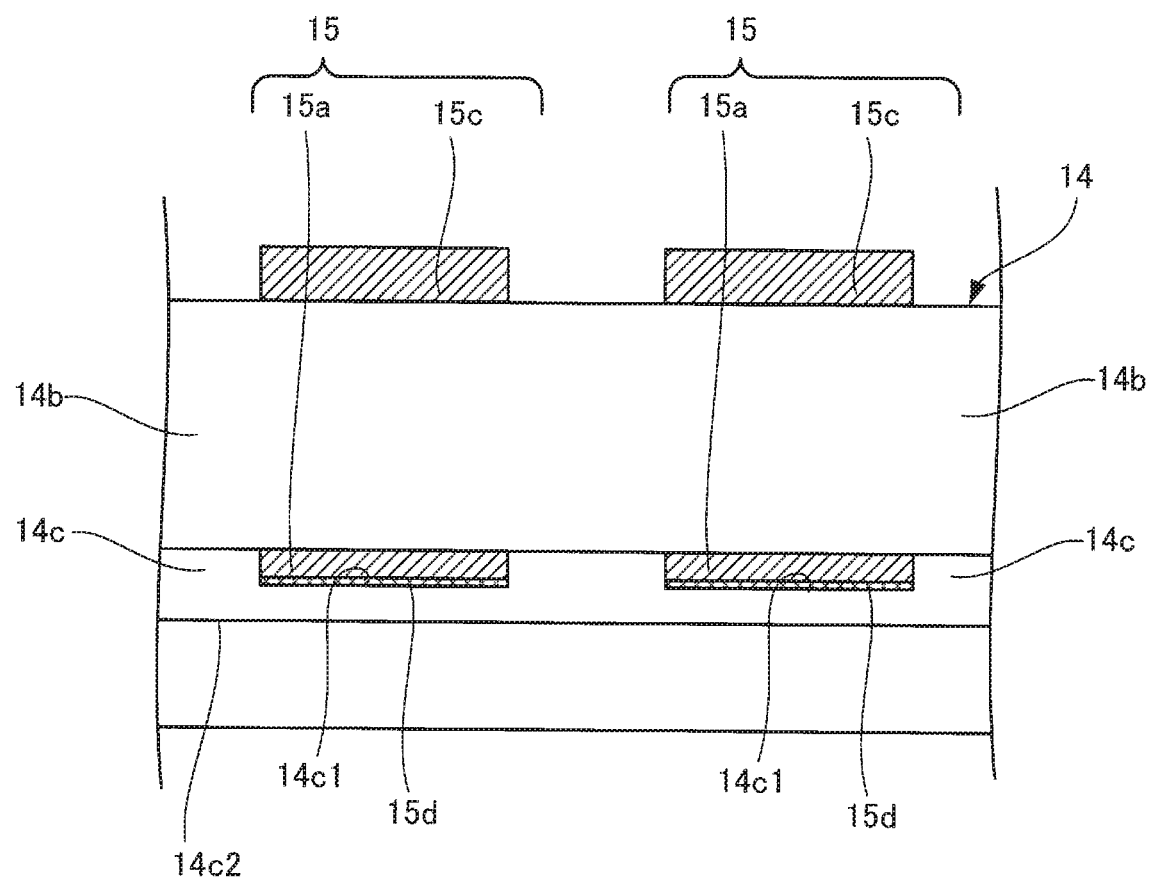
FIG. 3 is a cross-sectional view illustrating an inner wall section of the case of the semiconductor device according to the first embodiment.
Figure 4A:
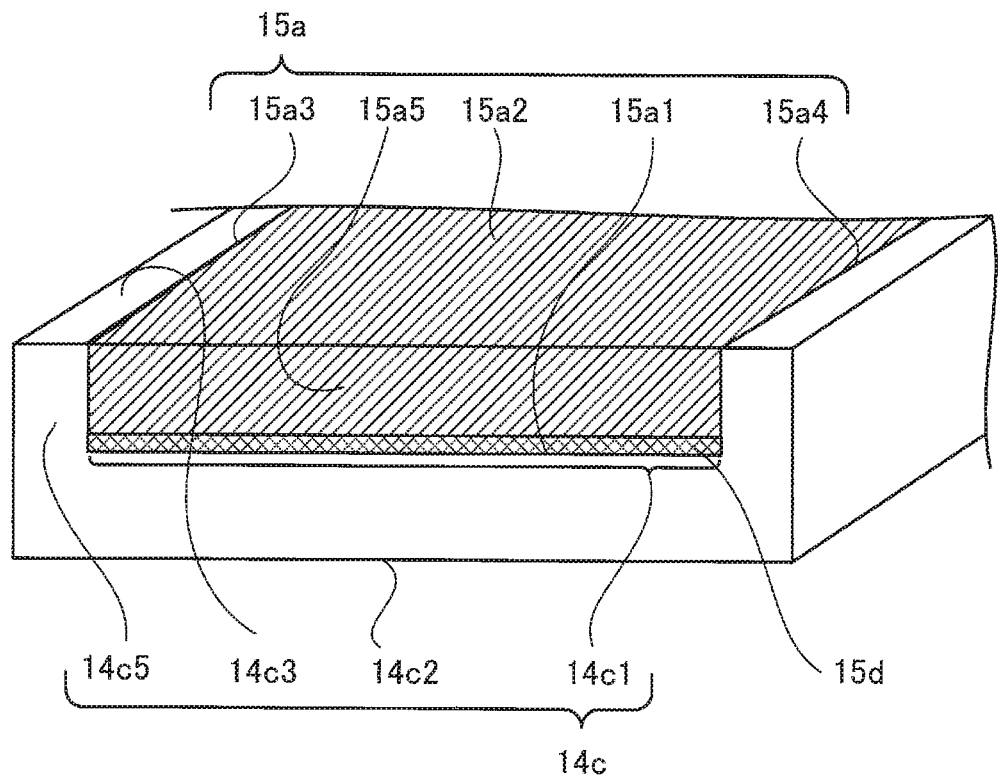
FIGS. 4A and 4B are enlarged diagrams illustrating a main part of a connecting terminal of the semiconductor device according to the first embodiment.
Figure 4B:
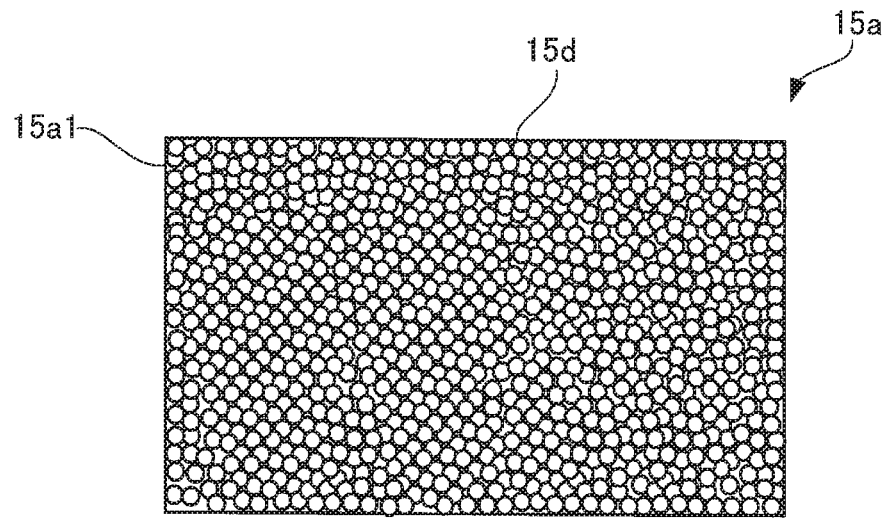

A semiconductor device according to a first embodiment will be described with reference to FIGS. 1 to 4. FIG. 1 is a cross-sectional view illustrating, by way of example, a main part of a semiconductor device according to a first embodiment. FIG. 2 is a plan view illustrating, by way of example, a main part of the semiconductor device according to the first embodiment. FIG. 3 is a cross-sectional view illustrating an inner wall section of the case of the semiconductor device according to the first embodiment. FIGS. 4A and 4B are enlarged diagrams illustrating a main part of a connecting terminal of the semiconductor device according to the first embodiment.

The cross-sectional view of FIG. 1 is taken along the dot-dash line Y-Y in FIG. 2, and the cross-sectional view of FIG. 3 is taken along the dot-dash line X-X in FIGS. 1 and 2. Further, FIG. 4A is an enlarged perspective diagram of the vicinity of an internal terminal portion 15a (described later), and FIG. 4B is an enlarged schematic diagram of a rough-surfaced area 15d formed on a rear surface 15a1 of the internal terminal portion 15a.

As illustrated in FIG. 1, the semiconductor device 10 includes a semiconductor element 11, a ceramic circuit substrate 12 to which the semiconductor element 11 is bonded on its front surface, a heat radiation plate 13 which is bonded to the rear surface of the ceramic circuit substrate 12, and a connecting terminal 15. These components of the semiconductor device 10 are housed in a case 14 and encapsulated with encapsulation resin 18. Note that the encapsulation resin 18 is omitted from FIGS. 2 to 4, and bonding wires 16 are omitted from FIGS. 3 and 4.

The semiconductor element 11 includes a switching element (e.g., IGBT, power MOSFET) made from silicon or silicon carbide. The semiconductor element has a drain electrode or a collector electrode on the rear surface. Also, the semiconductor element 11 has a gate electrode as well as a source electrode or an emitter electrode on the front surface.

Further, the semiconductor element 11 may include a diode, such as a Schottky barrier diode (SBD) and FWD, as needed. This semiconductor element 11 has a cathode electrode on the rear surface and an anode electrode on the front surface. There is one semiconductor element 11 on the ceramic circuit substrate 12 illustrated in FIG. 1. This is only an example and the number of semiconductor elements 11 is not limited to this example and may be modified according to the design.

The ceramic circuit substrate 12 includes an electric insulating board 12a, a conductive pattern 12b formed on the front surface of the electric insulating board 12a, and a metal plate 12c formed on the rear surface of the electric insulating board 12a.

The electric insulating board 12a is made from ceramics with high thermal conductivity, such as aluminum oxide, aluminum nitride, and silicon nitride. The electric insulating board 12a is preferably 0.2 mm to 1.5 mm thick, more preferably 0.25 mm to 1.0 mm thick.

The conductive pattern 12b is made from a material with high electrical conductivity, such as copper, aluminum, and an alloy containing at least one of these two materials. The conductive pattern 12b is preferably 0.1 mm to 1.0 mm thick, more preferably 0.125 mm to 0.6 mm thick.

The semiconductor device 10 includes at least one ceramic circuit substrate 12 having an electric insulating board 12a, a conductive pattern 12b, and a metal plate 12c, and a plurality of semiconductor elements 11 are bonded via solder 17a on to the conductive pattern 12b described above. On the conductive pattern 12b, electronic components (e.g., thermistors and capacitors) and wiring members (e.g., bonding wires and lead frame) may be placed together with the semiconductor element 11. In FIG. 1, the conductive pattern 12b and one end of the connecting terminal 15 to be described below are electrically connected with a bonding wire 16. With this structure, the main electrode on the rear surface of the semiconductor element 11 is electrically connected to the connecting terminal 15 via the conductive pattern 12b and the bonding wire 16. For the purpose of electrical connection between the conductive pattern 12b and the connecting terminal 15, the bonding wire 16 may be substituted by a lead frame, or the one end of the connecting terminal 15 may be extended so as to directly connect to the conductive pattern 12b.

The conductive pattern 12b may be plated with a corrosion-resistant material, such as aluminum, nickel, titanium, chromium, molybdenum, tantalum, niobium, tungsten, vanadium, bismuth, zirconium, hafnium, gold, silver, platinum, palladium, and an alloy containing at least one of these materials. FIGS. 1 to 3 illustrate such conductive patterns 12b as one example. The number, arrangement, and shape of conductive patterns 12b are not limited to this illustrated example and may be modified according to the design.

The metal plate 12c is made from a metal with high thermal conductivity, such as copper, aluminum, iron, silver and an alloy containing at least one of these materials. The metal plate 12c is preferably 0.1 mm to 1.0 mm thick, more preferably 0.125 mm to 0.6 mm thick.

As the ceramic circuit substrate 12 having the above structure, a direct copper bonded (DCB) substrate or an active metal brazed (AMB) substrate may be used. The ceramic circuit substrate 12 conducts heat generated in the semiconductor element 11 toward the heat radiation plate 13 via the conductive pattern 12b, electric insulating board 12a, and metal plate 12c. The electric insulating board 12a is rectangular in plan view, for example. The metal plate 12c is also rectangular in plan view but smaller in area than the electric insulating board 12a. The ceramic circuit substrate 12 is thus also rectangular, for example.

FIGS. 1 to 3 illustrate ceramic circuit substrates 12 as one example. The number, arrangement, and shape of ceramic circuit substrates 12 are not limited to the illustrated example and may be modified according to the design.

As illustrated in FIG. 1, the heat radiation plate 13 has a ceramic circuit substrate 12 on its front surface via solder 17b. The heat radiation plate 13 is made from, for example, aluminum, iron, silver, copper, or an alloy containing at least one of these materials, which have high thermal conductivity. The heat radiation plate 13 may be made from a composite material based on aluminum and silicon carbide or one based on magnesium and silicon carbide. Further, a material such as nickel may be plated on the front surface of the heat radiation plate 13 for better corrosion resistance. Besides nickel, the material may be a nickel-phosphorus alloy, nickel-boron alloy, or the like.

Further, a cooling device (not illustrated) may be bonded with solder, silver-based filler metal, or the like or mechanically attached via thermal paste or the like to the rear surface of the heat radiation plate 13 for improving heat radiation.

This cooling device is made from aluminum, iron, silver, copper, or an alloy containing at least one of these materials, which have high thermal conductivity, for example. A fin, heat sink composed of fins, water cooling system, or the like may be used as a cooling device. Alternatively, a cooling device may be integrated with the heat radiation plate 13. In this case as well, the heat radiation plate 13 is made from aluminum, iron, silver, copper or an ally containing at least one of these materials, which have high heat conductivity. For better corrosion resistance, a material such as nickel may be plated on the front surface of the heat radiation plate 13 with which a cooling device is integrated. Besides nickel, the material may be a nickel-phosphorus alloy, nickel-boron alloy, or the like. As an alternative to the heat radiation plate 13 described above, the foregoing cooling device may be bonded to the rear surface of the ceramic circuit substrate 12 via solder 17b.

The solder 17a and 17b used in the aforementioned semiconductor device 10 is composed of lead-free solder based mainly on one or more of the following examples of alloy: an alloy of tin, silver, and copper; an alloy of tin, zinc, and bismuth; an alloy of tin and copper; and an alloy of tin, silver, indium, and bismuth. Further, the solder 17a and 17b may include additives, such as nickel, germanium, cobalt, and silicon.

The case 14 has a frame 14a and a terminal arrangement portion 14c. The frame 14a includes inner wall sections 14b. The inner wall sections 14b face and surround an opening space 14a1 that is an area open at the center of the frame 14a and is rectangular in plan view. Note that the frame 14a is only partially illustrated in the first embodiment. The terminal arrangement portion 14c protrudes from an inner wall section 14b of the frame 14a towards the opening space 14a1.

Attached to the case 14 is a heat radiation plate 13 on which a semiconductor element 11 and a ceramic circuit substrate 12 are placed. Namely, the heat radiation plate 13 is attached to the frame 14a of the case 14 from behind the opening space 14a1 by using an adhesive (not illustrated). In this way, the semiconductor element 11 and the ceramic circuit substrate 12 are housed in the opening space 14a1. As illustrated in FIG. 1, encapsulation resin 18 may be placed between the heat radiation plate 13 and the rear surface 14c2 of the terminal arrangement portion 14c of the case 14. This structure is preferable for securing sufficient insulation property and keeping the size small, since the insulation distance between the connecting terminal 15 and the heat radiation plate 13 becomes relatively long.

Further, the case 14 is integrally structured with the connecting terminal 15 by using bonding resin suitable for the rough-surfaced internal terminal portion 15a of the connecting terminal 15, as described later. The resin may be polyphenylene sulfide (PPS), polybutylene terephthalate (PBT) resin, polyphthalamide (PPA) resin, or nylon resin (PA6, PA66), for example. In addition, the resin may include glass fiber or a filler. Silicon oxide, aluminum oxide, boron nitride, or aluminum nitride is suitable for the filler in respect of insulation property.

The connecting terminal 15 is insert-molded in the frame 14a of the case 14. The connecting terminal 15 is composed of an internal terminal portion 15a, a connecting section 15b, and an external terminal section 15c that are integrally connected.

As to the connecting terminal 15, the external terminal section 15c extends outward with respect to the top surface 14e of the frame 14a of the case 14, and the connecting section 15b is embedded in the frame 14a. In addition, the internal terminal portion 15a protrudes towards the opening space 14a1 with respect to the inner wall section 14b of the frame 14a. Further, the internal terminal portion 15a is embedded in the terminal arrangement portion 14c, at least its rear surface 15a1 is fixed to the terminal arrangement portion 14c, and at least its front surface is partially exposed to the opening space 14a1.

To implement the connecting terminal 15 described above, copper, aluminum, nickel, iron, or an alloy including at least one of these materials may be used.

The internal terminal portion 15a has the shape of a flat board, for example, and the front surface of its end portion above the terminal arrangement portion 14c is exposed to the opening space 14a1, while the rest is embedded in the frame 14a. That is, as illustrated in FIG. 4A, the internal terminal portion 15a is placed on the terminal area 14c1 of the terminal arrangement portion 14c. Only the front surface 15a2 of the internal terminal portion 15a is exposed at the level of a front surface 14c3 of the terminal arrangement portion 14c, and the rear surface 15a1 and a pair of side surfaces 15a3 and 15a4 are embedded in the terminal arrangement portion 14c. Also, a first end 15a5 of the internal terminal portion 15a is aligned with a second end 14c5 of the terminal arrangement portion 14c.

The front surface 15a2 of the internal terminal portion 15a is electrically connected to the semiconductor element 11. In FIG. 1, a bonding wire 16 provides an electrical connection between the exposed area of the front surface 15a2 of the internal terminal portion 15a and the conductive pattern 12b of the ceramic circuit substrate 12, and this electrical connection is extended to the semiconductor element 11 via the conductive pattern 12b. Further, in FIGS. 3 and 4, the front surface 15a2 of the internal terminal portion 15a is on a level with the front surface 14c3 of the terminal arrangement portion 14c. However, the front surface 15a2 of the internal terminal portion 15a may be set higher or lower than the front surface 14c3 of the terminal arrangement portion 14c.

The internal terminal portion 15a has a rough-surfaced area 15d on its rear surface 15a1. As illustrated in FIG. 4B, micro asperities are formed on the rough-surfaced area 15d. For example, micro holes are overlappingly formed on the rough-surfaced area 15d. Details of the rough-surfaced area 15d will be described later.

The connecting section 15b is joined to the rear end of the internal terminal portion 15a, stands up in parallel with the inner wall section 14b of the frame 14a, and protrudes with respect to the top surface 14e of the frame 14a.

The external terminal section 15c connects to the connecting section 15b and extends in parallel with the top surface 14e of the frame 14a. The external terminal section 15c is connected to an external power source (not illustrated) or the like.

As described previously, the opening space 14a1 of the frame 14a is filled with the encapsulation resin 18 to encapsulate the ceramic circuit substrate 12, the semiconductor element 11, the bonding wire 16, and the internal terminal portion 15a of the connecting terminal 15 over the heat radiation plate 13. The encapsulation resin 18 is made from thermosetting resin, such as epoxy resin, phenol resin, silicon resin, and maleimide resin. In addition, the encapsulation resin 18 may include silicon oxide, aluminum oxide, boron nitride, aluminum nitride, or the like as a filler.

The following description discusses manufacturing of the case 14 with a connecting terminal 15.

First, an unroughened connecting terminal 15 is prepared. No rough-surfaced area 15d is present in the connecting terminal 15 at this point. Then, at least the rear surface 15a1 of the internal terminal portion 15a of the connecting terminal 15 is roughened so that micro asperities are formed thereon. In this way, a rough-surfaced area 15d is formed on the rear surface 15a1 of the internal terminal portion 15a. It is preferable that arithmetic mean roughness Ra of this rough-surfaced area 15d be 0.1 μm to 1000 μm, more preferably 0.2 μm to 500 μm. If the arithmetic mean roughness Ra of the rough-surfaced area 15d is too large, there would be concave places that are not filled with resin, which results in deteriorating bonding quality. If the arithmetic mean roughness Ra is too small on the other hand, anchor effect does not work on the resin that forms the case 14, and thus the rough-surfaced area 15d is not properly fixed to the case 14. Further, at least the front surface 15a2 of the internal terminal portion 15a is not roughened as for the connecting terminal 15. It is preferable that arithmetic mean roughness Ra of the front surface 15a2 be below 0.1 μm. If the arithmetic mean roughness Ra of the front surface 15a2 is too large, it deteriorates the bond between the front surface 15a2 and wiring members such as a bonding wire 16 for electrical connection with the conductive pattern 12b and may lead to disconnection. Arithmetic mean roughness Ra is measured with a laser microscope, interatomic force microscope, and the like.

To roughen a surface, there is a chemical etching process that forms nano-sized dimples (micro holes), for example. During the process, the rear surface 15a1 of the internal terminal portion 15a is immersed in alkaline liquid (degreasing process) and then in acid liquid (neutralizing process). After that, the rear surface 15a1 is immersed in an etchant, thereby forming dimples having an average diameter of 20 nm to 1000 nm on the rear surface 15a1. Further, the rear surface 15a1 of the internal terminal portion 15a of the connecting terminal 15 is washed with water and dried with a dryer. In this way, the rough-surfaced area 15d is formed on the rear surface 15a1 of the internal terminal portion 15a of the connecting terminal 15. This process is only an example and may be replaced with a different process or method as far as micro asperities are formed on the rear surface 15a1 of the internal terminal portion 15a of the connecting terminal 15. For example, laser processing, blasting processing, thermal spraying, cutting, polishing processing, and pressing processing may be employed.

Next, a case 14 with a connecting terminal 15 partially embedded is formed by insert molding. For example, the insert molding process begins with setting the above-described connecting terminal 15 into a specified mold (not illustrated) and heating the mold with the connecting terminal 15 up to a predetermined temperature. Then, the process inject resin into the mold and waits until the injected resin solidifies. The resin used here may be polyphenylene sulfide, polybutylene terephthalate resin, polyphthalamide resin, nylon resin, or the like.

The mold is released in the end, and the case 14 with the connecting terminal 15 is obtained.

When the connecting terminal 15 is embedded in the case 14 in this way, the resin that forms the case 14 fills in the micro asperities in the rough-surfaced area 15d on the rear surface 15a1 of the internal terminal portion 15a of the connecting terminal 15, without leaving a gap. These micro asperities give anchor effect on the resin at the rough-surfaced area 15d, and thus the internal terminal portion 15a of the connecting terminal 15 is firmly fixed to the terminal area 14c1 of the terminal arrangement portion 14c of the case 14.

The following description discusses results of stress analysis around the internal terminal portion 15a of the connecting terminal 15 in the case 14 described above.

Figure 5A:
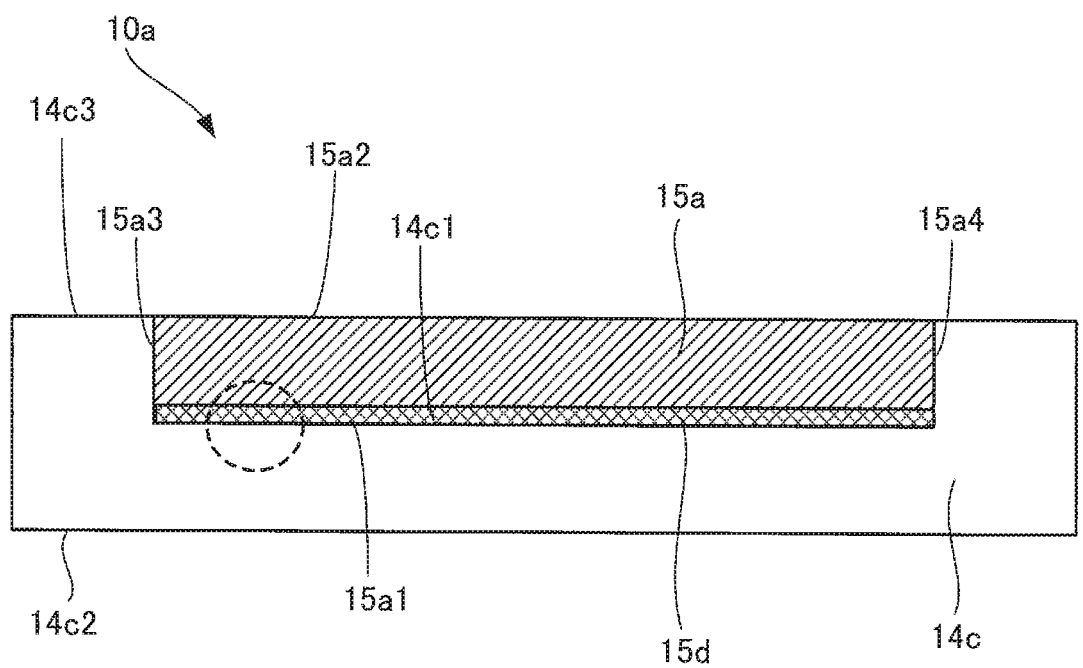
FIGS. 5A and 5B illustrate a model of an insert-molded case with a connecting terminal as part of the semiconductor device according to the first embodiment.
Figure 5B:
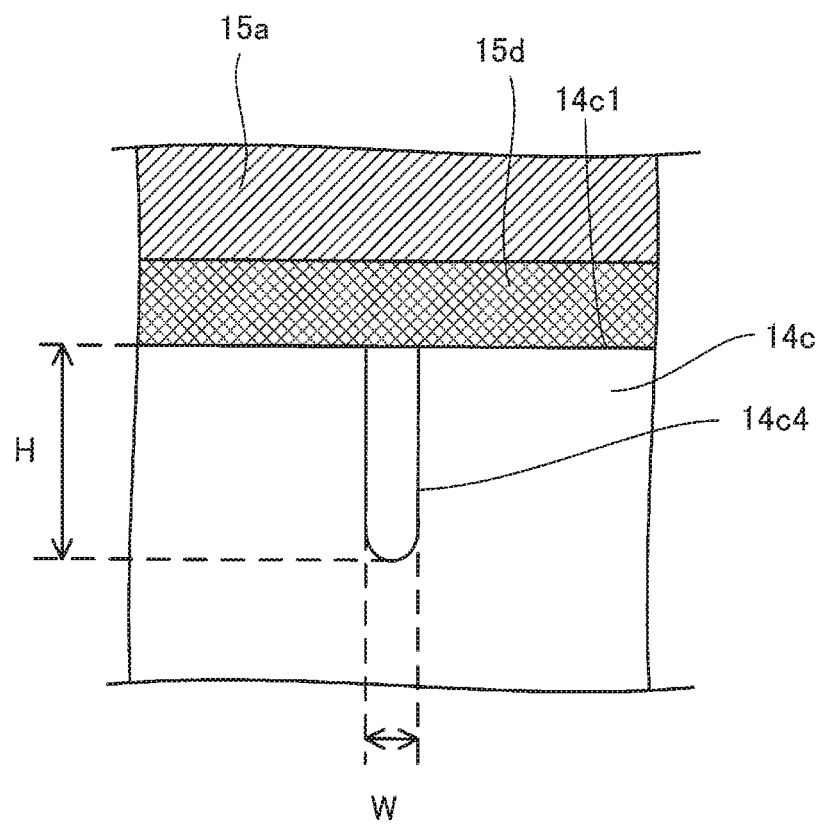

First, the description discusses how the semiconductor device 10 is modeled as the object of the analysis, with reference to FIGS. 5A and 5B. FIGS. 5A and 5B illustrate a model of an insert-molded case with a connecting terminal of the semiconductor device according to the first embodiment. FIG. 5A illustrates a cross-sectional view of this model 10a. FIG. 5B illustrates an example of a crack initiation part 14c4 formed in the model 10a. The dashed circle in FIG. 5A indicates where the crack initiation part 14c4 lies.

The model 10a illustrated in FIG. 5A is formed by imitating the vicinity of the internal terminal portion 15a of the connecting terminal 15, which is insert-molded into the terminal arrangement portion 14c of the case 14 of the semiconductor device 10. The same components as the semiconductor device 10 are marked with the same numerals, and their detailed descriptions are omitted.

Referring to the model 10a, it is assumed that a crack initiation part 14c4 has been formed, as illustrated in FIG. 5B, within a terminal area 14c1 of a terminal arrangement portion 14c of the case 14. For example, the crack initiation part 14c4 lies in the dashed circle in FIG. 5A. This crack initiation part 14c4 has a height H of about 15 μm and a diameter W of about 2.5 μm, for example.

The case 14 is formed by injecting resin into a mold as has been described. During this process, a thin line having a vulnerability, called a weld line, is formed in the place where two or more flows of the resin injected from multiple inlets of the mold meet and are welded together in the mold. Weld lines may cause poor appearance, deterioration of strength and toughness due to stress concentration, and the like. If weld lines are formed in the terminal arrangement portion 14c of the case 14, weak points, such as cracks and cuts, are likely to appear. The model 10a takes this into consideration and thus includes a crack initiation part 14c4 as described above.

Using the model 10a described above, an analysis was conducted on stress and deformation that may occur in the case 14 (the terminal arrangement portion 14c) during a thermal cycling test. Specifically, the model 10a was given a temperature change of −225° C., and the consequent stress in the case was analyzed. Here, the noted temperature change corresponds to the case where the model 10a is cooled from +175° C. to −50° C.

Figure 6:
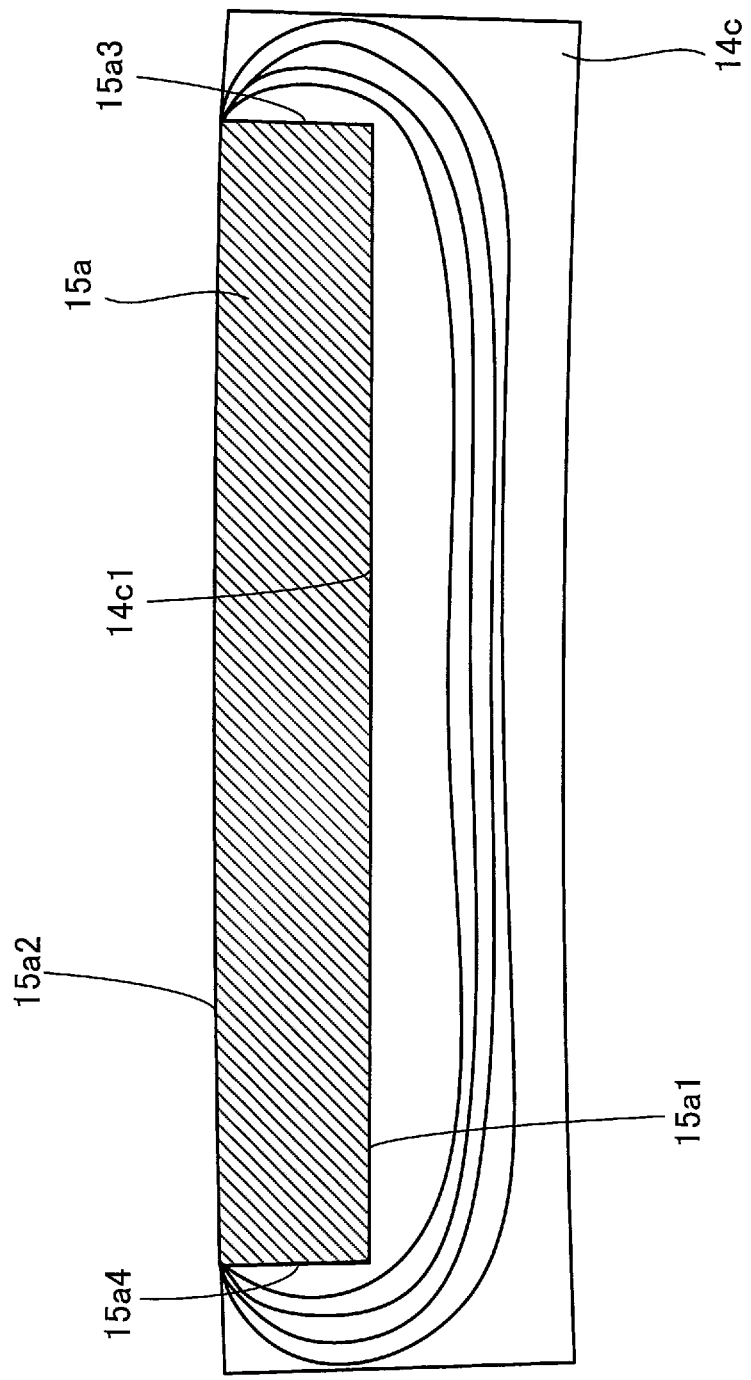
FIG. 6 illustrates stress distribution on the insert-molded case with a connecting terminal as part of the semiconductor device according to the first embodiment.

The result of the analysis will now be described below with reference to FIG. 6. FIG. 6 illustrates stress distribution on the insert-molded case with a connecting terminal as part of the semiconductor device according to the first embodiment. In FIG. 6, the rough-surfaced area 15d and the crack initiation part 14c4 are not illustrated, and the curved contour lines individually depict ranges of stress by magnitude.

According to FIG. 6, the internal terminal portion 15a is slightly curved in upward convex form due to the difference in thermal expansion coefficients between the terminal arrangement portion 14c and the internal terminal portion 15a. Since the terminal area 14c1 of the terminal arrangement portion 14c is fixed to the rear surface 15a1 of the internal terminal portion 15a, the internal terminal portion 15a has deformed along with the deformation of the terminal arrangement portion 14c, and thus there is no gap between the terminal area 14c1 and the rear surface 15a1.

According to the contour lines illustrated on the terminal arrangement portion 14c in FIG. 6, the stress increases as the distance from the internal terminal portion 15a decreases, or, in other words, the stress decreases as the distance from the internal terminal portion 15a increases. Further, it is clear that the contour lines are distributed evenly across the terminal arrangement portion 14c. These facts indicate that the stress develops substantially in an even manner across the terminal arrangement portion 14c of the case 14 and does not concentrate at any one place. In addition, it is found that the tip of the crack initiation part 14c4 has been subjected to a stress of up to 55.6 MPa.

The following description introduces several models as reference examples in contrast to the semiconductor device 10 described above and discusses the stress in these models.

Figure 7A:
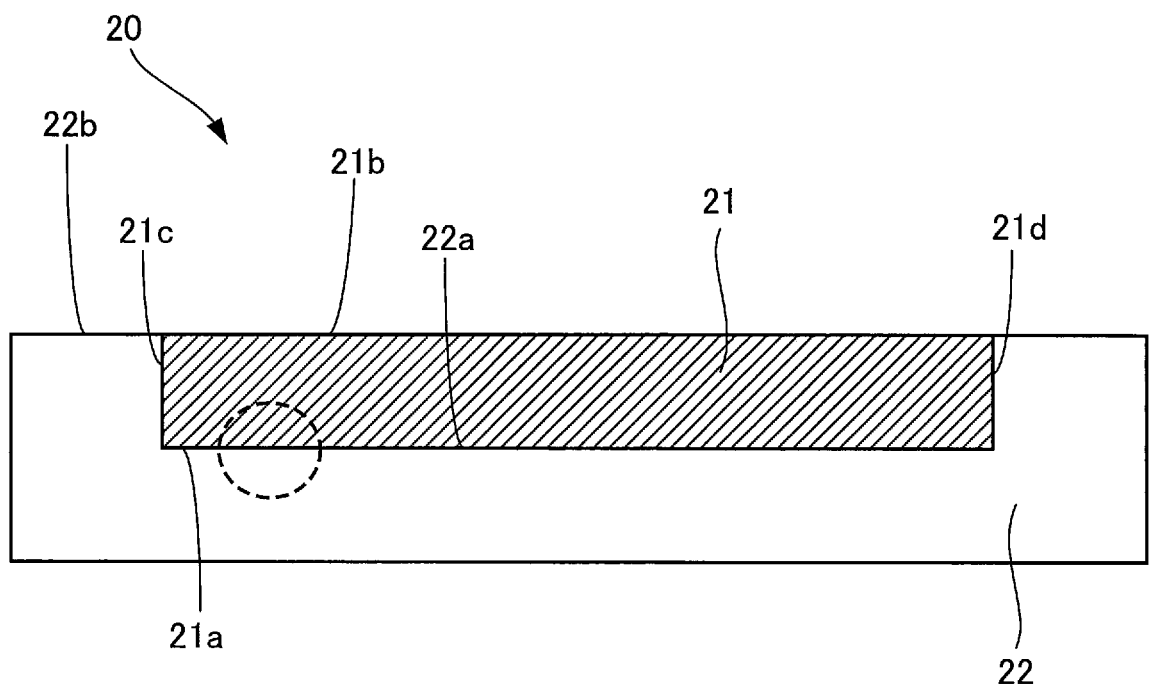
FIGS. 7A and 7B illustrate a model of an insert-molded case with a connecting terminal according to a first reference example.
Figure 7B:
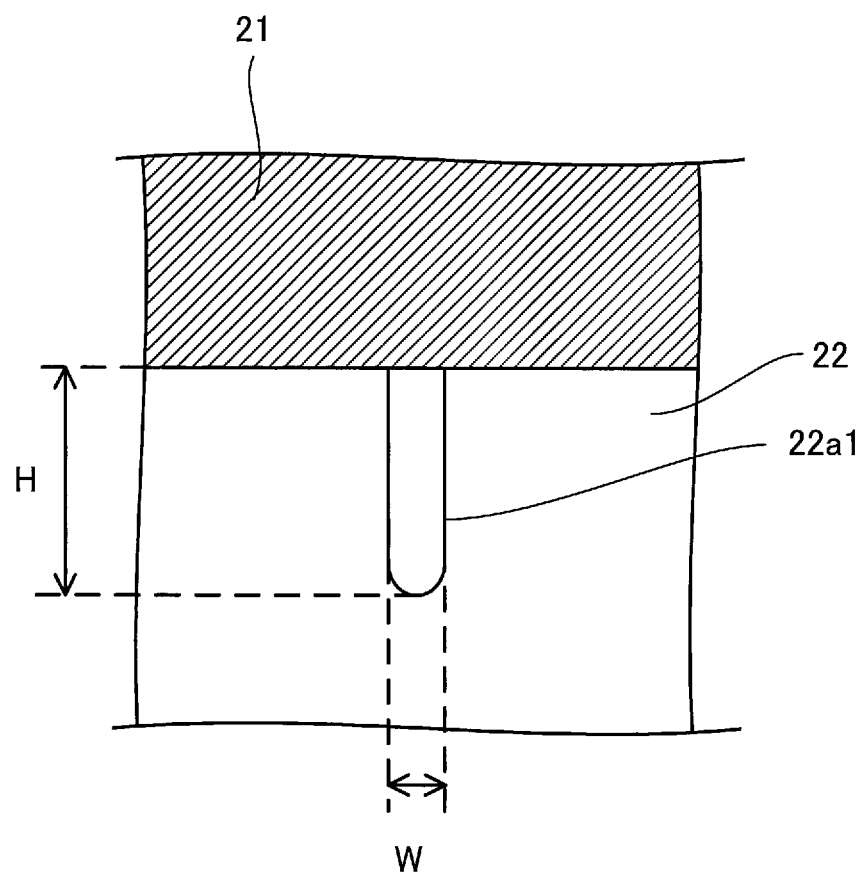

A first reference example will now be described with reference to FIGS. 7A and 7B. FIGS. 7A and 7B illustrate a model of an insert-molded case with a connecting terminal according to a first reference example. FIG. 7A illustrates a cross-sectional view of a model 20, and FIG. 7B illustrates an example of a crack initiation part 22a1 formed in the model 20. The dashed circle in FIG. 7A indicates where the crack initiation part 22a1 lies.

Similar to the model 10a in FIG. 5A, the model 20 illustrated in FIG. 7A includes a terminal arrangement portion 22 (a case) and an internal terminal portion 21. The internal terminal portion 21 is a part of a connecting terminal placed in a terminal area 22a of the terminal arrangement portion 22. As to the internal terminal portion 21, its rear surface 21a and side surfaces 21c and 21d are embedded in the terminal arrangement portion 22, and its front surface 21b is on a level with the front surface 22b of the terminal arrangement portion 22.

Referring to the model 20, it is also assumed, similarly to the model 10a in FIG. 5A, that a crack initiation part 22a1 has been formed, as illustrated in FIG. 7B, within the terminal area 22a of the terminal arrangement portion 22 of the case. For example, the crack initiation part 22a1 lies in the dashed circle in FIG. 7A. This crack initiation part 22a1 also has a height H of about 15 μm and a diameter W of about 2.5 μm.

That is, the model 20 is an example in which the model 10a illustrated in FIG. 5A is altered not to have a rough-surfaced area 15d.

Using the above model 20 as well, an analysis was conducted on stress and deformation that may occur in the terminal arrangement portion 22 of the case during a thermal cycling test similar to the one described above.

Figure 8:
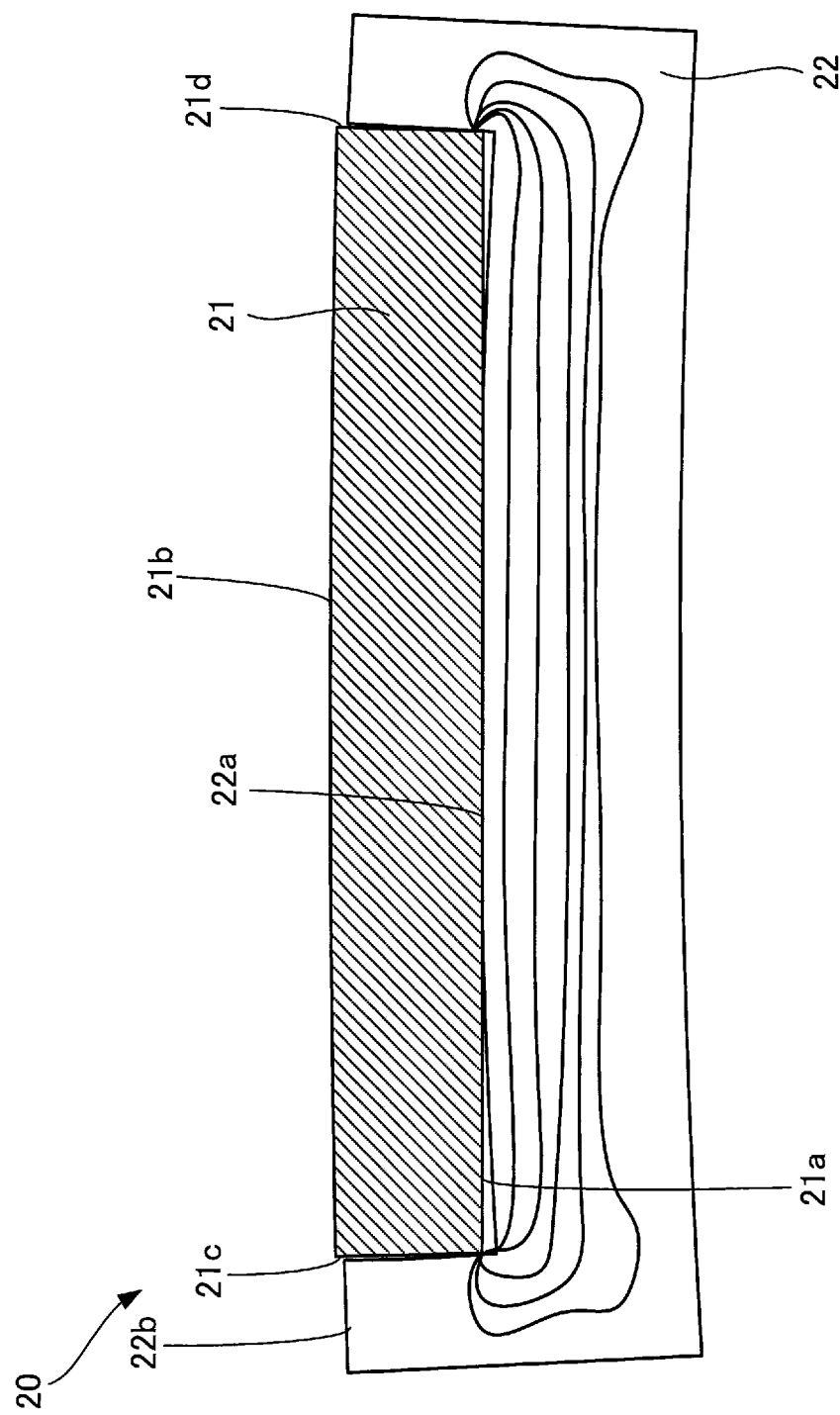
FIG. 8 illustrates stress distribution on the model of the insert-molded case with a connecting terminal according to the first reference example.

The result of the analysis will now be described below with reference to FIG. 8. FIG. 8 illustrates stress distribution on the model of the insert-molded case with a connecting terminal according to the first reference example. In FIG. 8 as well, the crack initiation part 22a1 is not illustrated, and the curved contour lines individually depict ranges of stress by magnitude.

According to FIG. 8, it is clear that the terminal area 22a of the terminal arrangement portion 22 is largely curved in upward convex form due to the difference in thermal expansion coefficients between the terminal arrangement portion 22 and the internal terminal portion 21. In the case of the model 20, the terminal area 22a of the terminal arrangement portion 22 is not fixed to the rear surface 21a of the internal terminal portion 21. Therefore, there are gaps between the terminal area 22a of the terminal arrangement portion 22 and the rear surface 21a of the internal terminal portion 21. In addition, there are gaps on both side surfaces 21c and 21d of the internal terminal portion 21.

According to the contour lines illustrated on the terminal arrangement portion 22 in FIG. 8, the stress increases as the distance from the rear surface 21a of the internal terminal portion 21 decreases, and the stress decreases as its location goes downward from the rear surface 21a. Further, it is clear that the contour lines are not evenly distributed across the terminal arrangement portion 22, and there is a warp directly under both sides of the rear surface 21a. These facts suggest that the stress develops not evenly across the terminal arrangement portion 22 of the case but is concentrated right under both sides of the rear surface 21a.

In addition, it is found that the tip of the crack initiation part 22a1 has been subjected to a stress of up to 91.1 MPa.

Figure 9:
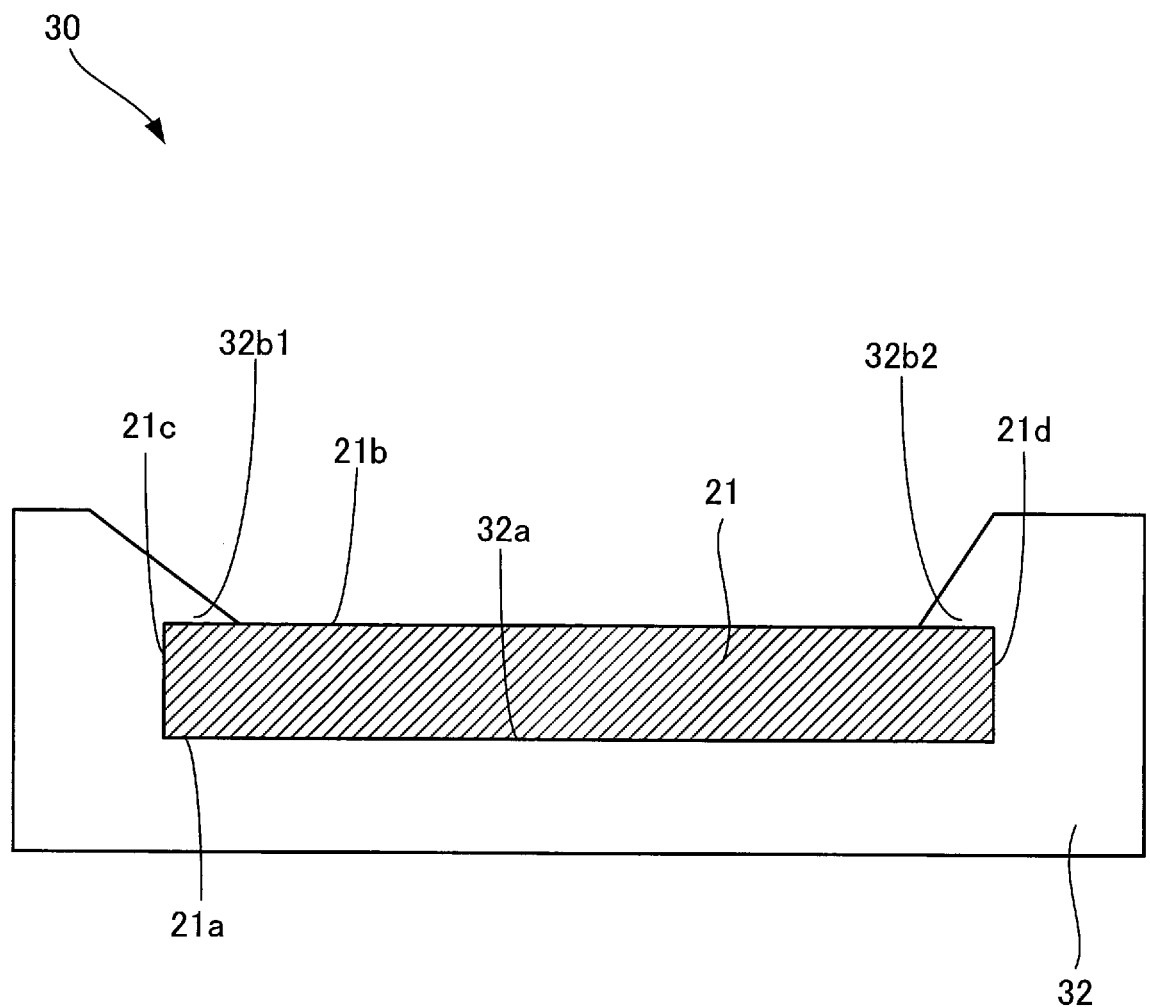
FIG. 9 illustrates a model of an insert-molded case with a connecting terminal according to a second reference example.

Next, a second reference example will now be described below with reference to FIG. 9. FIG. 9 illustrates a model of an insert-molded case with a connecting terminal according to a second reference example. In FIG. 9 as well, a crack initiation part is not illustrated although formed in this model 30 as in the model 20.

The model 30 illustrated in FIG. 9 includes an internal terminal portion 21 as in the model 20 illustrated in FIG. 7A. The internal terminal portion of the model 30 is embedded in a terminal arrangement portion 32 with its front surface 21b exposed, but the terminal arrangement portion 32 is formed into a shape that has pressing sections 32b1 and 32b2 to press both the left and right edges of the front surface 21b of the internal terminal portion 21.

The model 30 includes a crack initiation part in a terminal area 32a of the terminal arrangement portion 32, as with the case of the model 20, although it is not illustrated.

That is, the model 30 is an example in which the model 20 illustrated in FIG. 7A is altered to have both edges of the front surface 21b of the internal terminal portion 21 pressed by the pressing sections 32b1 and 32b2.

Using the above model 30 as well, an analysis was conducted on stress and deformation that may occur in the terminal arrangement portion 32 during a thermal cycling test similar to the one described above.

Figure 10:
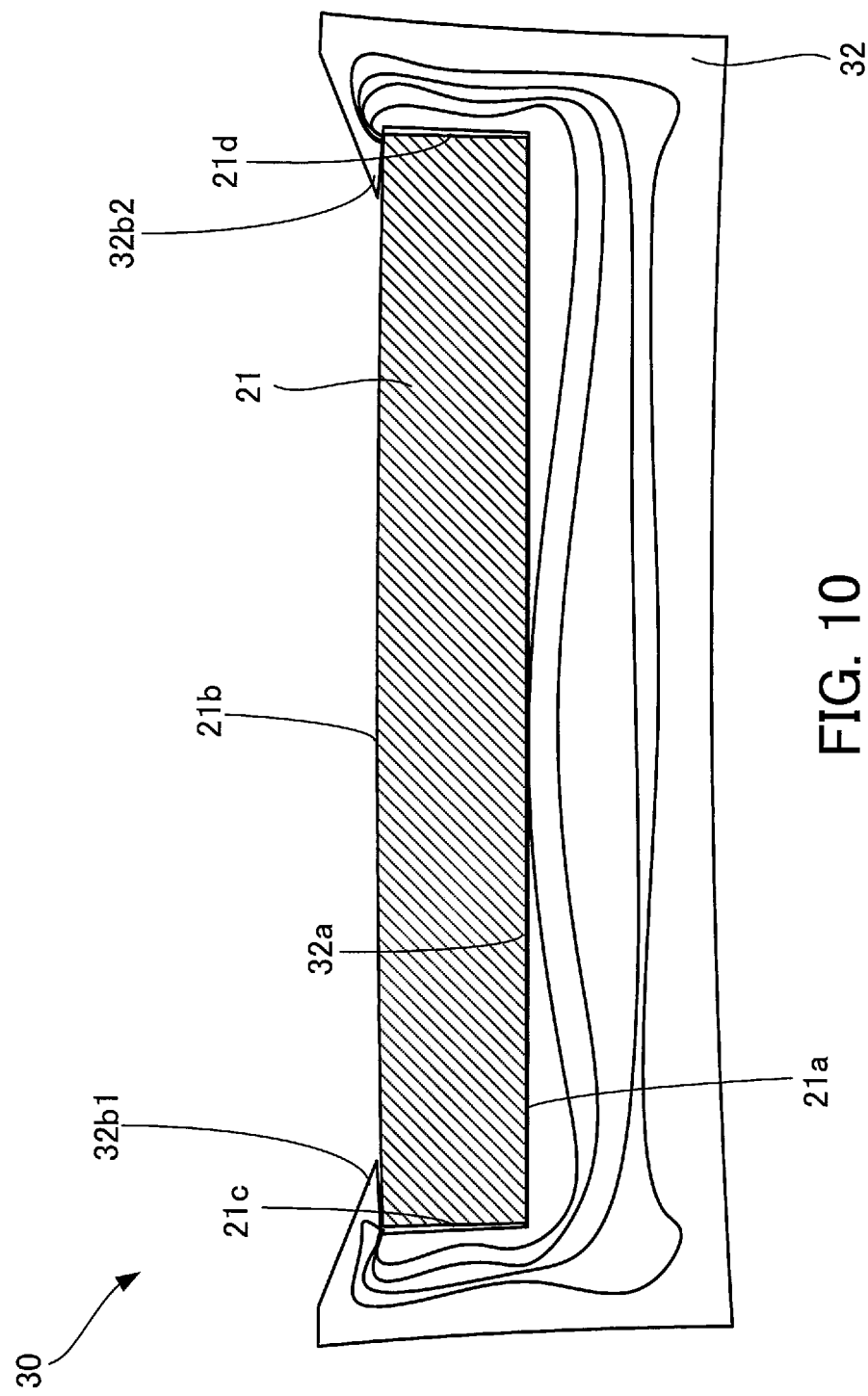
FIG. 10 illustrates stress distribution on the insert-molded case with a connecting terminal according to the second reference example.

The result of the analysis will now be described below with reference to FIG. 10. FIG. 10 illustrates stress distribution on the insert-molded case with a connecting terminal according to the second reference example. In FIG. 10 as well, the crack initiation part is not illustrated, and the curved contour lines individually depict ranges of stress by magnitude.

According to FIG. 10, it is clear that the internal terminal portion 21 is slightly curved in upward convex form due to the difference in thermal expansion coefficients between the terminal arrangement portion 32 and the internal terminal portion 21. In the case of the model 30, the terminal area 32a of the terminal arrangement portion 32 is not fixed to the rear surface 21a of the internal terminal portion 21. Although the pressing sections 32b1 and 32b2 suppress a warp in the internal terminal portion 21, there are gaps on both side surfaces 21c and 21d of the internal terminal portion 21.

According to the contour lines illustrated on the terminal arrangement portion 32 in FIG. 10, the stress increases as the distance from the internal terminal portion 21 decreases, and the stress decreases as its location goes downward from the rear surface 21a of the internal terminal portion 21. Further, it is clear that the contour lines are distributed all over the terminal arrangement portion 32, but the stress distribution is distorted in the vicinities of the corners of the internal terminal portion 21 and directly under both sides of the rear surface 21a of the internal terminal portion 21. These facts suggest that the stress develops not evenly across the terminal arrangement portion 32 of the case but concentrates in the vicinities of the corners of the internal terminal portion 21 and directly under both sides of the rear surface 21a.

In addition, it is found that the tip of the crack initiation part has been subjected to a stress of up to 87.1 MPa.

Figure 11:
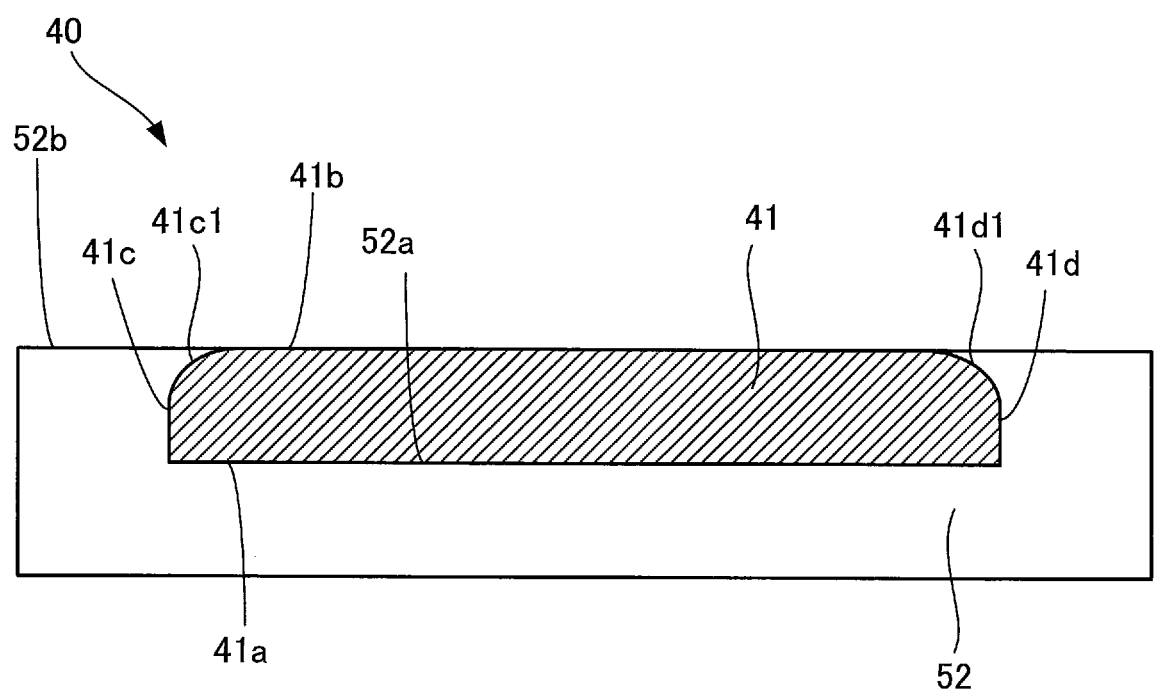
FIG. 11 illustrates a model of an insert-molded case with a connecting terminal according to a third reference example.

Next, a third reference example will now be described below with reference to FIG. 11. FIG. 11 illustrates a model of an insert-molded case with a connecting terminal according to a third reference example. In FIG. 11 as well, a crack initiation part is not illustrated although formed in this model 40 as in the model 20.

In the model 40 illustrated in FIG. 11, an internal terminal portion 41 is embedded in a terminal arrangement portion 52 while leaving its front surface 41b exposed just as in the model 20 of FIG. 7A. As to the internal terminal portion 41, its rear surface 41a and side surfaces 41c and 41d are embedded in the terminal arrangement portion 52, and the front surface 41b is on a level with a front surface 52b of the terminal arrangement portion 52.

Further, corner sections 41c1 and 41d1 run along both sides of the front surface 41b of the internal terminal portion 41. These corner sections 41c1 and 41d1 are rounded to have curved surfaces, thus being pressed by the terminal arrangement portion 52 when they are embedded in the terminal arrangement portion 52.

The model 40 includes a crack initiation part in a terminal area 52a of the terminal arrangement portion 52, as with the case of the model 20, although it is not illustrated.

That is, the model 40 is an example in which the model 20 illustrated in FIG. 7A is altered to have both sides of the front surface 21b of the internal terminal portion 21 rounded and pressed by the terminal arrangement portion 22.

Using the above model 40 as well, an analysis was conducted on stress and deformation that may occur in the terminal arrangement portion 52 of the case during a thermal cycling test similar to the one described above.

Figure 12:
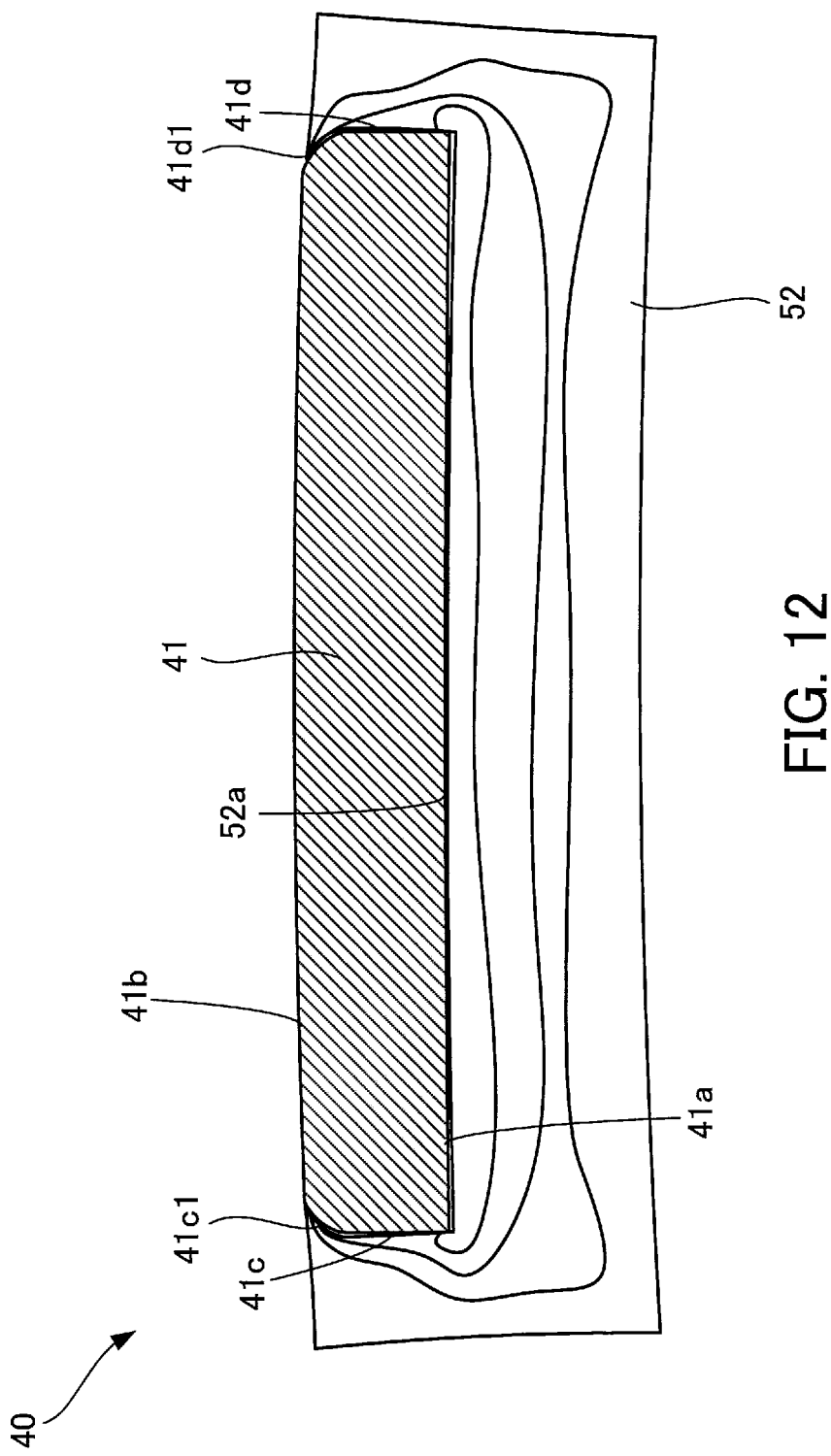
FIG. 12 illustrates stress distribution on the model of the insert-molded case with a connecting terminal according to the third reference example.

The result of the analysis will now be described with reference to FIG. 12. FIG. 12 illustrates stress distribution on the model of the insert-molded case with a connecting terminal according to the third reference example. In FIG. 12 as well, a crack initiation part is not illustrated, and the curved contour lines individually depict ranges of stress by magnitude.

According to FIG. 12, it is clear that the terminal area 52a of the terminal arrangement portion 52 is curved in upward convex form due to the difference in thermal expansion coefficients between the terminal arrangement portion 52 and the internal terminal portion 41. In the case of the model 40 as well, the terminal area 52a of the terminal arrangement portion 52 is not fixed to the rear surface 41a of the internal terminal portion 41. Although the terminal arrangement portion 52 presses the corner sections 41c1 and 41d1 of the internal terminal portion 41 and a warp in the internal terminal portion 41 is suppressed, there are gaps on both sides of the rear surface 41a (i.e., the sides close to the side surfaces 41c and 41d) of the internal terminal portion 41, as well as on the side surfaces 41c and 41d.

According to the contour lines illustrated on the terminal arrangement portion 52 in FIG. 12, the stress increases as the distance from the internal terminal portion 41 decreases and the stress decreases as its location goes downward from the rear surface 41a of the internal terminal portion 41. Further, it is clear that the contour lines are distributed all over the terminal arrangement portion 52, but the stress distribution is distorted in the vicinities of the corners of the internal terminal portion 41 and under both sides of the rear surface 41a of the internal terminal portion 41. These facts indicate that the stress develops not evenly across the terminal arrangement portion 52 of the case but concentrates in the vicinities of the corners of the internal terminal portion 41 and under both sides of the rear surface 41a.

In addition, it is found that the tip of the crack initiation part has been subjected to a stress of up to 94.4 MPa.

Figure 13:
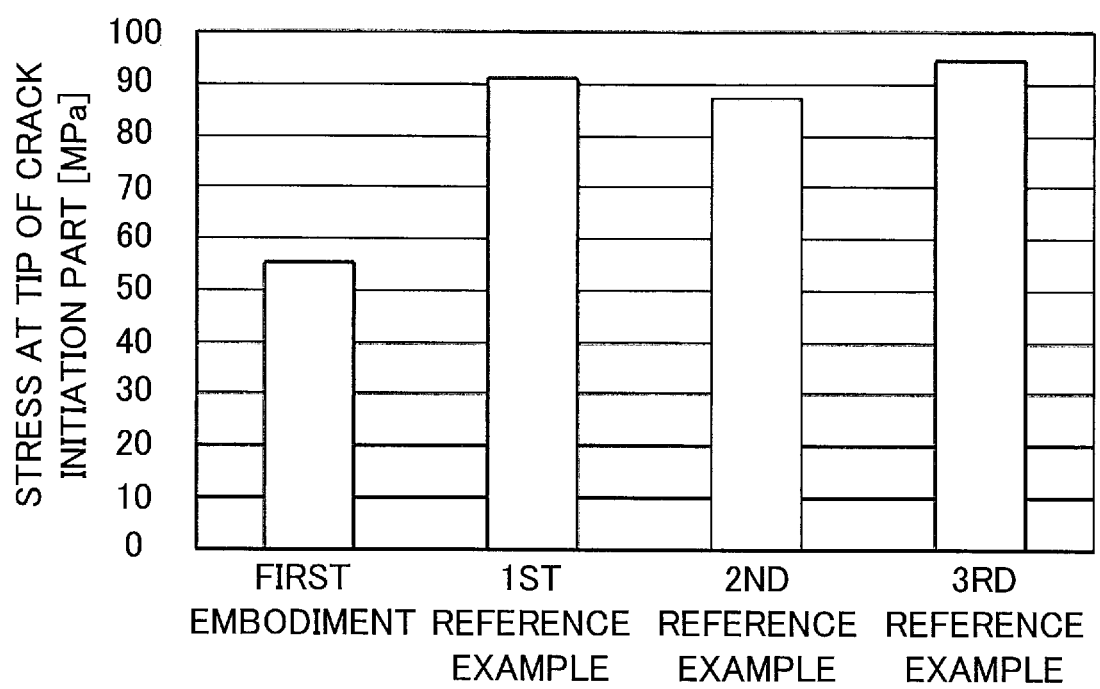
FIG. 13 is a graph illustrating stresses at the tips of individual crack initiation parts in their respective insert-molded cases having a connecting terminal.

The following description discusses stresses that develop at the tips of individual crack initiation parts of the aforementioned models 10a, 20, 30, and 40, with reference to FIG. 13. FIG. 13 is a graph illustrating stresses at the tips of individual crack initiation parts in their respective insert-molded cases having a connecting terminal. The horizontal axis in FIG. 13 indicates the following elements: the model 10a in FIG. 6 according to the first embodiment; the model 20 in FIG. 8 according to the first reference example; the model 30 in FIG. 10 according to the second reference example; and the model 40 in FIG. 12 according to the third reference example. The vertical axis in FIG. 13 indicates the magnitude of stress at the tips of individual crack initiation parts.

The graph indicates that the semiconductor device 10 (the model 10a) according to the first embodiment successfully suppresses the stress at the tip of its crack initiation part. The reason is as follows.

In the semiconductor device 10, a rough-surfaced area 15d filled with micro asperities is formed on a rear surface 15a1 of an internal terminal portion 15a of a connecting terminal 15. When its case 14 is formed by insert molding with this connecting terminal 15, the constituent resin of the case 14 fully fills in the micro asperities in the rough-surfaced area 15d of the rear surface 15a1 of the internal terminal portion 15a of the connecting terminal 15. The resin solidifies in this condition to form the case 14, and eventually the rear surface 15a1 of the internal terminal portion 15a is fixed to a terminal area 14c1 of a terminal arrangement portion 14c of the case 14. Hence, the internal terminal portion 15a of the connecting terminal 15 deforms together with the deformation of the terminal arrangement portion 14c of the case 14 when the semiconductor device 10 is exposed to thermal changes. Therefore, the stress is distributed evenly across the terminal arrangement portion 14c of the case 14, thus reducing stress concentration at a weak point in the terminal arrangement portion 14c. This means that the stress at a crack initiation part is also reduced, and thus making it less likely that cracks would develop and grow.

The aforementioned semiconductor device 10 includes a semiconductor element 11, a connecting terminal 15 electrically connected to the semiconductor element 11, and a case 14 including an opening space 14a1 for housing the semiconductor element 11, a frame 14a which surrounds the opening space 14a1 and in which the connecting terminal 15 is partially embedded, and a terminal arrangement portion 14c which protrudes from the frame 14a towards the opening space 14a1. Further, the connecting terminal 15 of the semiconductor device includes an internal terminal portion 15a. The internal terminal portion 15a extends towards the opening space 14a1 with respect to the frame 14a, its front surface is electrically connected to the semiconductor element and exposed to the opening space 14a1, and its rear surface is fixed to the terminal arrangement portion 14c.

In the semiconductor device 10, the rear surface 15a1 of the internal terminal portion 15a of the connecting terminal 15 is fixed to the terminal arrangement portion 14c of the case 14. Because of this, even where the semiconductor device 10 is exposed to thermal changes, the internal terminal portion 15a of the connecting terminal 15 deforms along with the deformation of the terminal arrangement portion 14c of the case 14. Therefore, the stress develops evenly across the terminal arrangement portion 14c of the case 14, thus reducing stress concentration to a weak point in the terminal arrangement portion 14c. This means that the stress at a crack initiation part is also reduced, thus making it less likely that cracks would develop and grow. Accordingly, it is possible to prevent the semiconductor device 10 from becoming less reliable.

Additionally, the mechanical strength of the case 14 does not restrict the selection of resin for forming the case 14. For this reason, the designer is allowed to select a resin for the semiconductor device 10 from a wider range of choices.

Further, since it is possible to design the structure of the semiconductor device 10 without considering structural deficiencies, the designer is allowed to design its structure with fewer restrictions.

The first embodiment has exemplified the case where the rear surface 15a1 of the internal terminal portion 15a of the connecting terminal 15 is roughened to form a rough-surfaced area 15d. The side surfaces 15a3 and 15a4 of the internal terminal portion 15a may be roughened in addition to the rear surface 15a1. With this structure, the internal terminal portion 15a of the connecting terminal 15 is more firmly fixed to the terminal arrangement portion 14c of the case 14.

Second Embodiment

Figure 14:
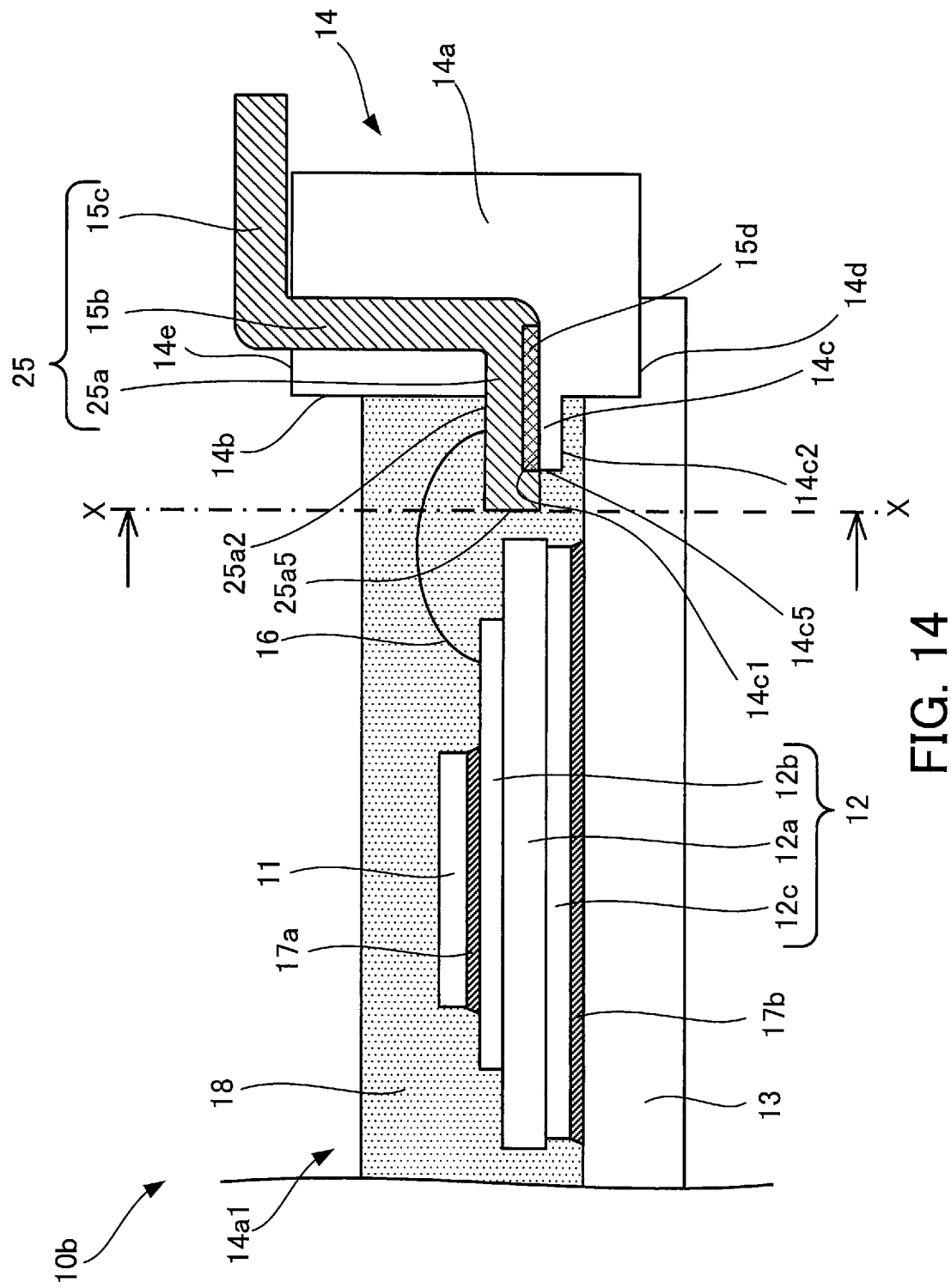
FIG. 14 is a cross-sectional view illustrating, by way of example, a main part of a semiconductor device according to a second embodiment.
Figure 15A:
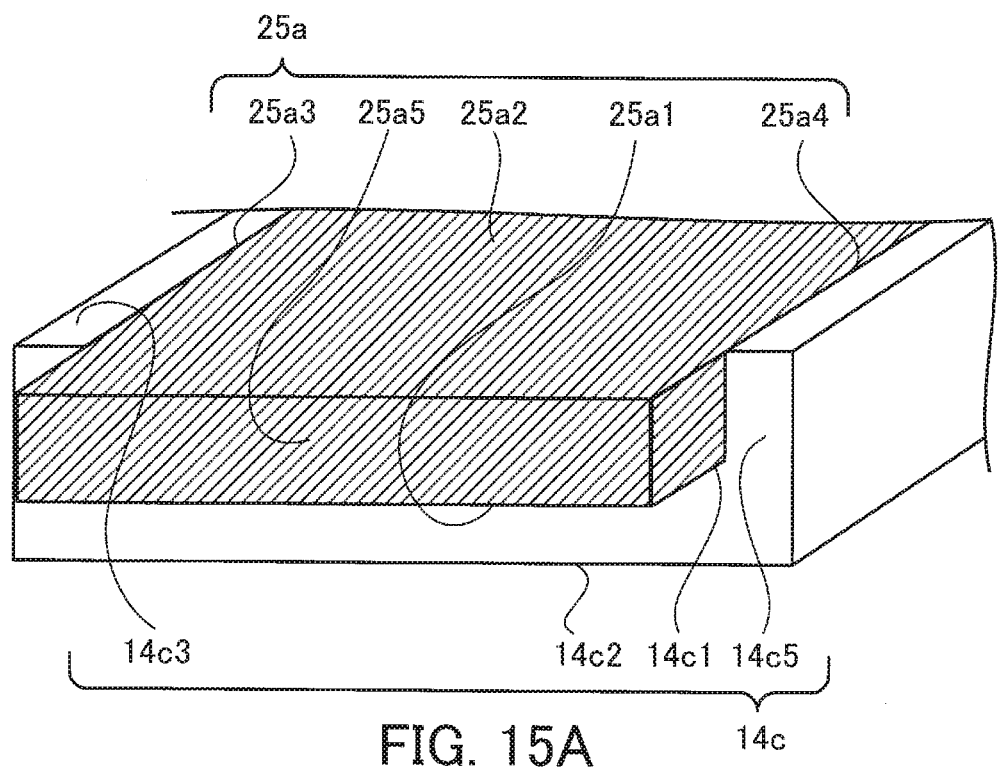
FIGS. 15A and 15B are enlarged diagrams each illustrating a main part of a connecting terminal of the semiconductor device according to the second embodiment.
Figure 15B:
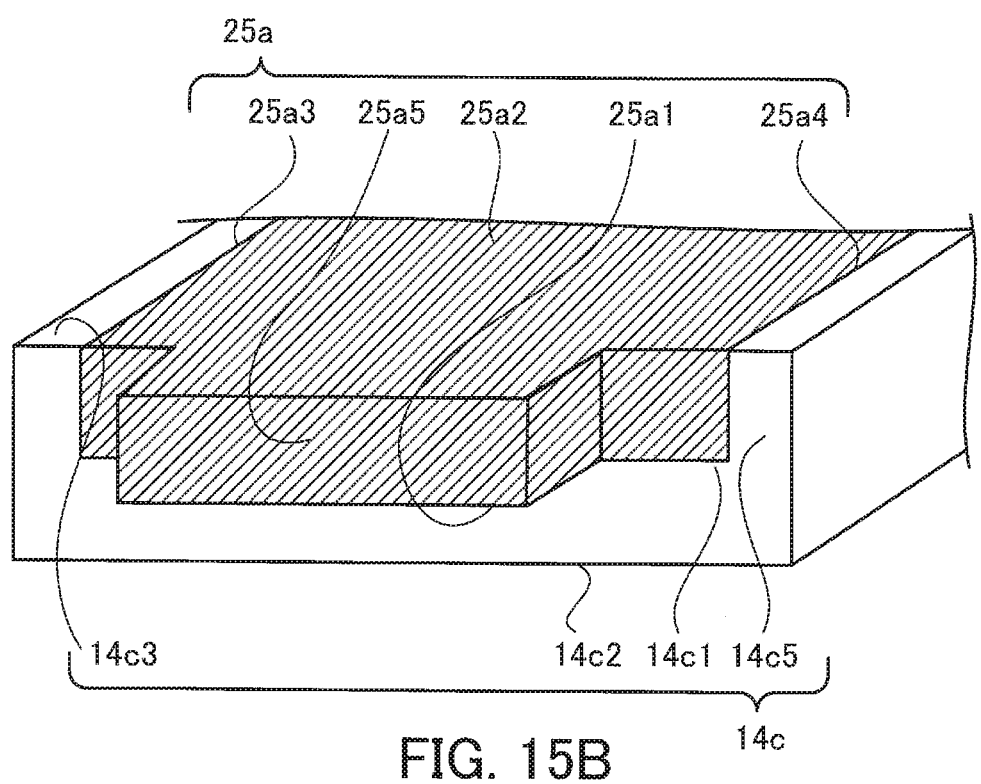

In the second embodiment, several variations in which connecting terminals differ from the one according to the first embodiment will be discussed with reference to FIGS. 14, 15A, and 15B. FIG. 14 is a cross-sectional view illustrating, by way of example, a main part of a semiconductor device according to a second embodiment. FIGS. 15A and 15B are enlarged diagrams each illustrating a main part of a connecting terminal of the semiconductor device according to the second embodiment. The semiconductor device 10b illustrated in FIG. 14 includes components that are similar to those in the semiconductor device 10. These like components are marked with the like numerals, and their detailed descriptions are omitted. FIGS. 15A and 15B correspond to FIG. 4A of the first embodiment and are perspective diagrams in the vicinity of an internal terminal portion 25a taken along the dot-dash line X-X in FIG. 14. FIGS. 15A and 15B illustrate different internal terminal portions 25a as part of respective connecting terminals 25.

Connecting terminals 25 of the semiconductor device 10b are installed at a pair of shorter sides of the frame 14a of the case 14 by insert molding. Referring now to FIG. 14, the illustrated connecting terminal 25 is composed of an internal terminal portion 25a, a connecting section 15b, and an external terminal section 25c that are integrally connected. The connecting terminal 25 is made from copper, aluminum, nickel, iron, or an alloy including at least one of these materials as in the first embodiment.

The internal terminal portion 25a also has the shape of a flat board, for example, and the front surface 25a2 of its end portion above the terminal arrangement portion 14c is exposed to the opening space 14a1, while the rest is embedded in the case 14. That is, as illustrated in FIG. 14, the internal terminal portion 25a is installed on a terminal area 14c1 of the terminal arrangement portion 14c of the case 14. Only its front surface 25a2 of the internal terminal portion 25a is exposed at the level of the front surface 14c3 of the terminal arrangement portion 14c of the case 14, and its rear surface 25a1 and side surfaces 25a3 and 25a4 are embedded in the terminal arrangement portion 14c.

The front surface 25a2 of the internal terminal portion 25a is electrically connected to the semiconductor element 11. In FIG. 14, the exposed section of the front surface 25a2 of the internal terminal portion 25a is electrically connected to the conductive pattern 12b of the ceramic circuit substrate 12 with the bonding wire 16 and is thus electrically connected further to the semiconductor element 11 via the conductive pattern 12b. The front surface 25a2 of the internal terminal portion 25a in FIGS. 14, 15A, and 15B is at the same height as the front surface 14c3 of the terminal arrangement portion 14c. Alternatively, the front surface 25a2 may be higher or lower than the front surface 14c3. Further, a rough-surfaced area 15d is formed also on the rear surface 25a1 of the internal terminal portion 25a (where the rear surface 25a1 contacts with the terminal arrangement portion 14c). The method of forming the rough-surfaced area 15d on the rear surface 25a1 of the internal terminal portion 25a is the same as in the first embodiment.

The internal terminal portion 25a has a first end 25a5 that protrudes towards the opening space 14a1 with respect to the second end 14c5 of the terminal arrangement portion 14c.

The entire first end 25a5 of the internal terminal portion 25a may protrude as illustrated in FIG. 15A. Alternatively, only a central part of the first end 25a5 may protrude and the side parts of the first end 25a5 may remain aligned with the second end 14c5 of the terminal arrangement portion 14c, such that the first end 25a5 would have a stepwise shape.

Figure 16A:
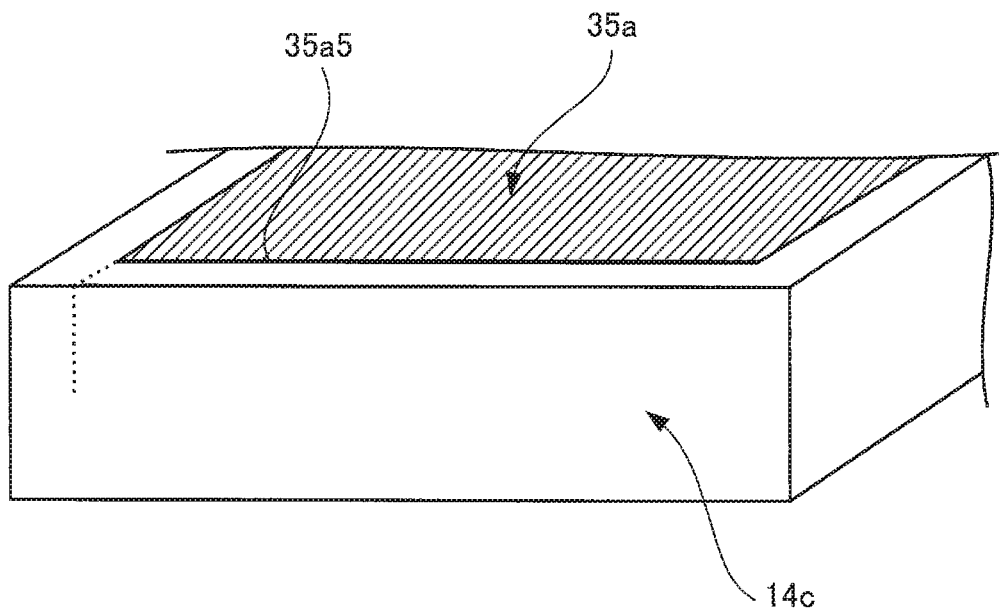
FIGS. 16A and 16B illustrate insert-molded cases with individual connecting terminals according to a fourth reference example.
Figure 16B:
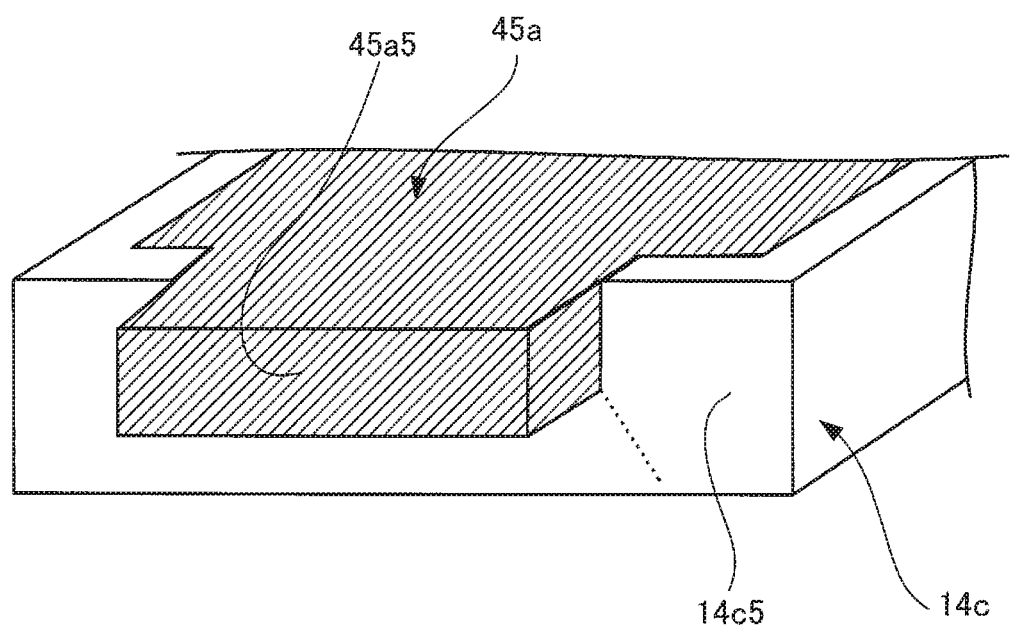

With reference to FIGS. 16A and 16B, other possible designs of cases 14 (terminal arrangement portions 14c) formed by insert molding with individual connecting terminals will be discussed below as reference examples. FIGS. 16A and 16B illustrate insert-molded cases with individual connecting terminals according to a fourth reference example. More specifically, FIG. 16A illustrates an example where an internal terminal portion 35a of a connecting terminal is embedded in a terminal arrangement portion 14c with the first end not exposed but covered. FIG. 16B illustrates an example of an internal terminal portion 45a embedded in the terminal arrangement portion 14c in which only a central part of its first end 45a5 protrudes while the remaining parts of the first end 45a5 are covered.

In the design illustrated in FIG. 16A, if the terminal arrangement portion 14c that covers the first end 35a5 of the internal terminal portion 35a is thin, the covering terminal arrangement portion 14c is susceptible to cracks and such cracks could easily develop as the dot line depicts in FIG. 16A, for example. One possible solution to this problem is to thicken the terminal arrangement portion 14c that covers the first end 35a5 of the internal terminal portion 35a. However, this solution makes it difficult to downsize the semiconductor device because the case 14 would become larger.

In the design illustrated in FIG. 16B, if the terminal arrangement portion 14c that covers the non-protruding part of the first end 45a5 of the internal terminal portion 45a is thin, the covering terminal arrangement portion 14c is susceptible to cracks similarly to the foregoing design, and such cracks could easily develop as the dot line depicts in FIG. 16B, for example. One possible solution to this problem is to thicken the terminal arrangement portion 14c that covers the first end 45a5 of the internal terminal portion 45a. However, this solution makes it difficult to downsize the semiconductor device because the case 14 would become larger.

Considering the above, it is preferable that the first end 25a5 of the internal terminal portion 25a of the connecting terminal protrude with respect to the second end 14c5 of the terminal arrangement portion 14c, as illustrated in FIG. 15A. More preferably, only a central part of the first end 25a5 protrudes while both side parts of the first end 25a5 remain aligned with the second end 14c5 of the terminal arrangement portion 14c, and the resulting stepwise structure is exposed to outside over the second end 14c5 of the terminal arrangement portion 14c, as illustrated in FIG. 15B.

The case 14 having such connecting terminals 25 may be manufactured in the same way as in the first embodiment. That is, an unroughened connecting terminal in which no rough-surfaced area 15d is present on the rear surface 25a1 of its internal terminal portion 25a is prepared first, and then the rear surface 25a1 of the internal terminal portion 25a is roughened to have a rough-surfaced area 15d. In the design of the internal terminal portion 25a illustrated in FIG. 15B, both sides of the central part of the first end 25a5 are removed in advance.

The following process begins with setting the connecting terminal 25 as described into a specified mold (not illustrated) and heating the mold with the connecting terminal 25 to a specified temperature. Then, the process injects resin into the mold and waits until the injected resin solidifies. The resin used here may be polyphenylene sulfide, polybutylene terephthalate resin, polyphthalamide resin, nylon resin, or the like. The mold is released in the end, and the case 14 with the connecting terminal 25 is obtained.

The case 14 formed in this way has a terminal area 14c1 in the terminal arrangement portion 14c to which the internal terminal portion 25a of the connecting terminal 25 is firmly fixed.

Referring again to the first embodiment discussed with reference to FIG. 1, the first end 15a5 of the internal terminal portion 15a of the connecting terminal 15 is set to be aligned with the second end 14c5 of the terminal arrangement portion 14c of the case 14. When the resin is injected into the mold, there could be a space between the first end 15a5 of the internal terminal portion 15a and the mold depending on how properly the connecting terminal 15 is set in the mold. If the connecting terminal 15 is poorly set in the mold, a burr is formed on the first end 15a5 as the resin fills into the space. Such a burr on the first end 15a5 may lead to a crack, scar, and the like.

In contrast to the above, because the first end 25a5 of the internal terminal portion 25a of the connecting terminal 25 protrudes with respect to the second end 14c5 of the terminal arrangement portion 14c of the case 14, it is possible to fix the protruding part on the mold so that there would be no space for resin intrusion, and thus no burr formation at the first end 25a5. The case 14 is finished after the injected resin solidifies. Its terminal arrangement portion 14c is well formed, being free from cracks, scars, and the like.

In the above-described semiconductor device 10b as well, the rear surface 25a1 of the internal terminal portion 25a of the connecting terminal 25 is fixed to the terminal arrangement portion 14c of the case 14. Therefore, the internal terminal portion 25a of the connecting terminal 25 deforms together with the deformation of the terminal arrangement portion 14c of the case 14 when the semiconductor device 10b is exposed to thermal changes. Hence, the stress develops evenly across the terminal arrangement portion 14c of the case 14, thus reducing stress concentration at a weak point in the terminal arrangement portion 14c.

Further, in the semiconductor device 10b, the first end 25a5 of the internal terminal portion 25a of the connecting terminal 25 protrudes towards the opening space 14a1 with respect to the second end 14c5 of the terminal arrangement portion 14c of the case 14. This structure makes it less likely that cracks and the like would appear in the terminal arrangement portion 14c of the case 14. Therefore, it is possible to reduce the chances of producing weak points in the terminal arrangement portion 14c.

As a result, crack initiation parts, if any, are kept in a reduced stress condition. That is, it is possible to reduce, or even eliminate, the chances for a crack to develop and grow, thus preventing the semiconductor device 10b from becoming less reliable.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a semiconductor element;
   a connecting terminal that is electrically connected to the semiconductor element; and
   a case made of a resin, and including:
      an opening space for housing the semiconductor element;
      a frame which surrounds the opening space and in which the connecting terminal is partially embedded; and
      a terminal arrangement portion which protrudes from the frame towards the opening space, the frame and the terminal arrangement portion of the case being made of the same material, wherein
   the connecting terminal includes an internal terminal portion that extends towards the opening space with respect to the frame, the internal terminal portion having a front surface that is electrically connected to the semiconductor element and exposed to the opening space, and a rear surface that is fixed to the terminal arrangement portion, and
   the rear surface of the internal terminal portion has a rough-surfaced area filled with micro asperities having micro holes that overlap one another and that are filled by the resin forming the case without leaving any gap, and the rough-surfaced area is directly formed on the rear surface and is directly fixed to the terminal arrangement portion.

2. The semiconductor device according to claim 1, wherein arithmetic mean roughness of the micro asperities is in a range of 0.1 µm to 1000 µm.

3. The semiconductor device according to claim 1, wherein each of the micro holes has a diameter in a range of 20 nm to 1000 nm on average.

4. The semiconductor device according to claim 1, wherein:
   the internal terminal portion further includes a pair of side surfaces that are perpendicular to the front surface and the rear surface and embedded in the terminal arrangement portion; and
   the rough-surfaced area is formed on the pair of side surfaces.

5. The semiconductor device according to claim 1, wherein the connecting terminal is made of copper, aluminum, nickel, iron, or an alloy containing at least one of copper, aluminum, nickel, and iron.

6. The semiconductor device according to claim 1, wherein the case is made of polyphenylene sulfide, polybutylene terephthalate resin, polyphthalamide resin, or nylon resin.

7. The semiconductor device according to claim 1, wherein the internal terminal portion further includes an end portion that is entirely exposed to the opening space over the terminal arrangement portion.

8. The semiconductor device according to claim 7, wherein the end portion of the internal terminal portion protrudes towards the opening space with respect to an end portion of the terminal arrangement portion that faces the opening space.

9. The semiconductor device according to claim 8, wherein
the end portion of the internal terminal portion includes one side portion and the other side portion, and a central portion between the one side portion and the other side portion,
the one side portion and the other side portion are aligned with the end portion of the terminal arrangement portion, and the central portion of the end portion of the internal terminal portion protrudes towards the opening space with respect to the end portion of the terminal arrangement portion, such that the end portion of the internal terminal portion has a stepwise shape.

10. The semiconductor device according to claim 1, wherein the micro asperities of the rough-surfaced area are integrally formed in the rear surface of the internal terminal portion.

11. A semiconductor device comprising:
a semiconductor element;
a connecting terminal that is electrically connected to the semiconductor element; and
a case made of a resin, and including:
an opening space for housing the semiconductor element;
a frame which surrounds the opening space and in which the connecting terminal is partially embedded; and
a terminal arrangement portion which protrudes from the frame towards the opening space in a protruding direction, the frame and the terminal arrangement portion of the case being made of the same material, wherein
the connecting terminal includes an internal terminal portion that extends towards the opening space with respect to the frame, the internal terminal portion having a front surface that is electrically connected to the semiconductor element and is exposed to the opening space and a rear surface that is fixed to the terminal arrangement portion,
the internal terminal portion includes an end portion at a side opposite to a side where the frame is located,
the end portion has, in a direction orthogonal to the protruding direction, one and an other side portions and a central portion between the one and other side portions,
only the central end portion among the rest of the end portion protrudes from the terminal arrangement portion and is entirely exposed to the opening space over the terminal arrangement portion, and
each end surface of the one and other side end portions forming, together with an end surface of the terminal arrangement portion, a flat surface that is orthogonal to the front surface and the protruding direction.

12. The semiconductor device according to claim 11, wherein the rear surface of the internal terminal portion has a rough-surfaced area filled with micro asperities having micro holes that overlap one another and are filled by the resin forming the case without leaving any gap.

13. The semiconductor device according to claim 11, wherein the front surface of the internal terminal portion is entirely exposed to the opening space.

14. The semiconductor device according to claim 12, wherein the front surface of the internal terminal portion is entirely exposed to the opening space.

15. A semiconductor device, comprising:
a semiconductor element;
a connecting terminal that is electrically connected to the semiconductor element; and
a case including:
an opening space for housing the semiconductor element;
a frame which surrounds the opening space and in which the connecting terminal is partially embedded; and
a terminal arrangement portion which protrudes from the frame towards the opening space in a protruding direction, the frame and the terminal arrangement portion of the case being made of the same material, wherein
the connecting terminal includes an internal terminal portion that extends towards the opening space with respect to the frame, the internal terminal portion having a front surface that is electrically connected to the semiconductor element and that is exposed to the opening space and a rear surface that is fixed to the terminal arrangement portion,
the internal terminal includes an end portion at a side opposite to a side where the frame is located,
the end portion has, in a direction orthogonal to the protruding direction, one and the other side portions and a central portion between the one and other side portions,
only the central end portion among the rest of the end portion protrudes from the terminal arrangement portion in the protruding direction such that the end portion has a stepwise shape in a plan view of the semiconductor device, and
the central end portion is entirely exposed to the opening space over the terminal arrangement portion, and the one and other side end portions other than their front surfaces are entirely embedded within the terminal arrangement portion.

* * * * *